US010651415B2

(12) United States Patent
Kagotani et al.

(10) Patent No.: US 10,651,415 B2
(45) Date of Patent: May 12, 2020

(54) ORGANIC EL (ELECTROLUMINESCENT) DEVICE

(71) Applicant: TOPPAN PRINTING CO., LTD., Taito-ku (JP)

(72) Inventors: Akihito Kagotani, Taito-ku (JP); Toshiki Toda, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/822,286

(22) Filed: Nov. 27, 2017

(65) Prior Publication Data

US 2018/0076410 A1 Mar. 15, 2018

Related U.S. Application Data

(63) Continuation of application No. PCT/JP2016/002545, filed on May 26, 2016.

(30) Foreign Application Priority Data

May 28, 2015 (JP) ................................. 2015-108994

(51) Int. Cl.
*G02B 5/02* (2006.01)
*H01L 51/52* (2006.01)

(52) U.S. Cl.
CPC ............ *H01L 51/5225* (2013.01); *G02B 5/02* (2013.01); *H01L 51/5209* (2013.01);
(Continued)

(58) Field of Classification Search
CPC ............. H01L 51/5225; H01L 51/5209; H01L 51/5262; H01L 51/5268; H01L 51/5275; G02B 5/02
See application file for complete search history.

(56) References Cited

U.S. PATENT DOCUMENTS

| 8,541,778 B2 | 9/2013 | Seki et al. | |
| 8,849,072 B2 * | 9/2014 | Montoya | B82Y 20/00 385/130 |

(Continued)

FOREIGN PATENT DOCUMENTS

| JP | 2007-207471 A | 8/2007 |
| JP | 4740403 B | 8/2011 |

(Continued)

OTHER PUBLICATIONS

Written Opinion of the International Searching Authority; International application No. PCT/JP2016/002545 (dated 2016).*

(Continued)

*Primary Examiner* — Allen L Parker
*Assistant Examiner* — Charles N Ausar-El
(74) *Attorney, Agent, or Firm* — Oblon, McClelland, Maier & Neustadt, L.L.P.

(57) ABSTRACT

An organic EL (electroluminescent) device includes a translucent substrate, a transparent electrode, a luminescent layer, and a cathode placed over one surface of the translucent substrate, and a light extraction film having unevenness placed on the other surface. The surface of the cathode facing the luminescent layer has a plurality of recesses or protrusions. The Fourier transform image of the surface of the cathode facing the luminescent layer has a surface plasmon absorption suppression area including a spatial frequency v obtained from Eq. (I) and a light scattering area not including spatial frequencies equal to or greater than the spatial frequency v.

20 Claims, 17 Drawing Sheets

(52) U.S. Cl.
CPC ...... *H01L 51/5262* (2013.01); *H01L 51/5268* (2013.01); *H01L 51/5275* (2013.01)

(56) References Cited

U.S. PATENT DOCUMENTS

| | | | |
|---|---|---|---|
| 9,246,122 B2 | 1/2016 | Shinotsuka et al. | |
| 9,728,751 B2 | 8/2017 | Shinotsuka et al. | |
| 2009/0195879 A1* | 8/2009 | Dal Negro | B82Y 20/00 359/586 |
| 2012/0132897 A1* | 5/2012 | Seki | G02B 5/1809 257/40 |
| 2014/0008623 A1* | 1/2014 | Heuser | H01L 51/0091 257/40 |
| 2014/0027753 A1* | 1/2014 | Yamana | H01L 51/5209 257/40 |
| 2014/0167017 A1 | 6/2014 | Shinotsuka et al. | |
| 2015/0034925 A1* | 2/2015 | Shinotsuka | H01L 51/5218 257/40 |
| 2016/0035991 A1* | 2/2016 | Yamae | H01L 51/5004 257/40 |
| 2016/0149149 A1* | 5/2016 | Shinotsuka | H01L 51/0017 136/255 |
| 2017/0301887 A1 | 10/2017 | Shinotsuka et al. | |

FOREIGN PATENT DOCUMENTS

| | | |
|---|---|---|
| JP | 5283206 B | 9/2013 |
| WO | WO 2013/005638 A1 | 1/2013 |
| WO | WO 2013/099915 A1 | 7/2013 |
| WO | WO 2015/072070 A1 | 5/2015 |

OTHER PUBLICATIONS

International Search Report dated Jul. 12, 2016 in PCT/JP2016/002545, filed May 26, 2016.

Vincent et al., "Watersheds in Digital Spaces: An Efficient Algorithm Based on Immersion Simulations", IEEE Transactions on Pattern Analysis and Machine Intelligence, vol. 13, No. 6, Jun. 1991, pp. 583-598.

* cited by examiner

ORGANIC EL (ELECTROLUMINESCENT) DEVICE

CROSS-REFERENCE TO RELATED APPLICATIONS

The present application is a continuation of International Application No. PCT/JP2016/002545, filed May 26, 2016, which is based upon and claims the benefits of priority to Japanese Application No. 2015-108994, filed May 28, 2015. The entire contents of these applications are incorporated herein by reference.

BACKGROUND OF THE INVENTION

Field of the Invention

The present invention relates to an organic EL (electroluminescent) device which effectively alleviates surface plasmon absorption at a cathode and has improved light extraction efficiency.

Discussion of the Background

In recent years, a general organic EL (electroluminescent) device has only 20% light extraction efficiency from a transparent substrate into the air. Accordingly, considering mass productivity and the like, an external film is attached to the device in many cases. Although it depends on the device structure, the light extraction efficiency is about 30% even when an external film is attached to the organic EL (electroluminescent) device, and loss of light is large.

As a means for further improving the light extraction efficiency, providing a light scattering structure is being considered in order to alleviate total reflection due to the difference in refractive index between the transparent substrate and the transparent electrode. The light scattering structure alleviates the total reflection of light and allows more light to be extracted. However, even when an external film is used together, the light extraction efficiency of an organic EL (electroluminescent) device having a light scattering structure is only about 40%.

In order to obtain a higher light extraction effect, it has been proposed to provide a fine uneven structure at the cathode part to alleviate light absorption at the cathode part due to surface plasmons (see PTL 1). According to this proposal, the surface of the cathode part has a two-dimensional lattice structure in which a plurality of recesses are arranged at a certain interval in two dimensions. This two-dimensional lattice structure functions as a diffraction grating and converts the surface plasmons generated by light at the cathode into light again, thereby improving light extraction efficiency.

Light can be efficiently extracted by setting the interval of the two-dimensional lattice structure at an interval that is optimum for conversion of surface plasmons to light. However, such two-dimensional lattice structures limit the direction in which light is efficiently extracted in the two-dimensional plane by the direction in which the plurality of recesses in the structure are arranged. Thus, in directions other than the highly efficient direction, the interval of the two-dimensional lattice structure is not optimum for conversion of surface plasmons to light, and light cannot be extracted efficiently.

It has also been proposed to provide an uneven structure whose Fourier transform image is circular or annular on the surface of the cathode part. According to this proposal, it is said that high light extraction efficiency can be realized in all directions, since recesses or protrusions exist at an appropriate spatial frequency that is optimum for conversion of surface plasmons to light in every direction. However, according to this proposal, the matching with an external film having an uneven surface for suppressing total reflection at the interface between the transparent substrate and the air is insufficient. This is because, as with the two-dimensional lattice structure, the external film has a direction in which light extraction is easy and a direction in which light extraction is difficult depending on the arrangement of the recesses and protrusions. Even if the all-direction surface plasmons to light conversion is realized by using the uneven structure on the surface of the cathode part with a circular or annular Fourier transform image, light could not be extracted to the outside due to total reflection at the interface between the external film and the air.

PTL 1: JP 5283206 B
PTL 2: JP 4740403 B
NPL 1: Vincent L., Soille P., "Watersheds in digital spaces: an efficient algorithm based on immersion simulations", Pattern Analysis and Machine Intelligence, IEEE transaction on, Vol. 13, Issue 6, pp. 583-598 (1991)

SUMMARY OF THE INVENTION

According to an aspect of the present invention, an organic EL device includes a translucent substrate having a first surface and a second surface opposite to the first surface, a transparent electrode formed on the first surface of the translucent substrate, a cathode having a surface on which a plurality of recesses or protrusions are formed, a luminescent layer formed between the transparent electrode and the cathode and facing the surface of the cathode having the recesses or protrusions, and a light extraction film positioned on the second surface of the translucent substrate and having unevenness. The cathode has the recesses or protrusions formed such that the surface has a Fourier transform image which includes one or more surface plasmon absorption suppression areas having a spatial frequency v and one or more light scattering areas that do not include a spatial frequency equal to or greater than the spatial frequency v, and the spatial frequency v is obtained from Equation (I)

$$v = \frac{1}{\lambda} \times \mathrm{Re}\left(\sqrt{\frac{\varepsilon_1 \times \varepsilon_2}{\varepsilon_1 + \varepsilon_2}}\right) \quad (\mathrm{I})$$

where $\varepsilon_1$ is a relative permittivity of the luminescent layer, $\varepsilon_2$ is a relative permittivity of the cathode, Re( ) is a function for extracting a real part of a complex number, and $\lambda$ is a central wavelength of an emission spectrum of the luminescent layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
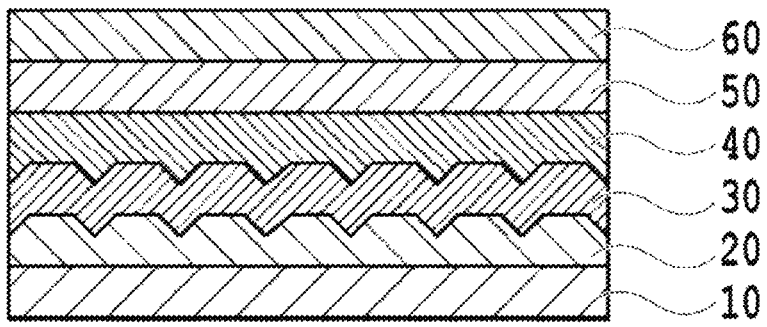
FIG. 1 is a schematic cross-sectional view of a top emission type organic EL (electroluminescent) device provided with an uneven structure on the cathode side.
Figure 1:
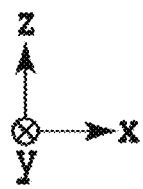

The embodiments will now be described with reference to the accompanying drawings, wherein like reference numerals designate corresponding or identical elements throughout the various drawings.

Normally, part of the light emitted from the light emitting layer of the organic EL (electroluminescent) device is lost before it is emitted outside. The main causes of this loss of light include 1) total reflection at the interface between the translucent substrate and the air, 2) total reflection at the interface between the transparent electrode and the translucent substrate, and 3) surface plasmon absorption at the cathode.

If a structure for scattering light is provided on the surface of the translucent substrate facing the air, 1) total reflection at the interface between the translucent substrate and the air can be suppressed. Further, if a structure for scattering light is provided on the side of the translucent substrate facing the transparent electrode, 2) total reflection at the interface between the transparent electrode and the translucent substrate can be suppressed. As for 3) surface plasmon absorption at the cathode, it is known to suppress loss of light due to surface plasmon absorption by providing an uneven structure on the cathode.

Figure 2:
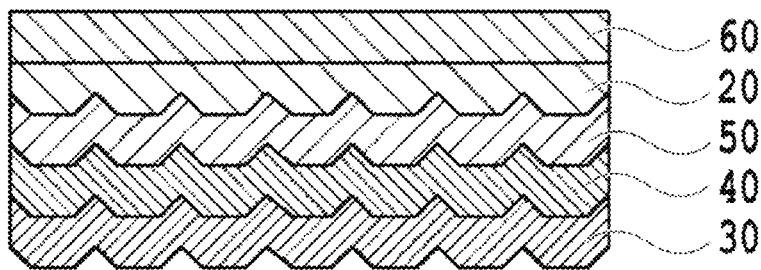
FIG. 2 is a schematic cross-sectional view of a bottom emission type organic EL (electroluminescent) device provided with an uneven structure on the anode side.
Figure 2:
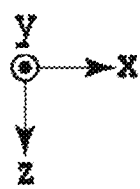

FIG. 1 shows a configuration example of a top emission type organic EL (electroluminescent) device in which an uneven structure layer 20, a cathode 30, a luminescent layer 40, and an anode (transparent electrode) 50 are stacked in this order on a substrate 10 and a translucent substrate 60 is provided on the anode 50. FIG. 2 shows a configuration example of a bottom emission type organic EL (electroluminescent) device in which an uneven structure layer 20, an anode (transparent electrode) 50, a luminescent layer 40, and a cathode 30 are stacked in this order on a translucent substrate 60. In the structures shown in FIGS. 1 and 2, an uneven structure is formed on the surface of the cathode 30 facing the luminescent layer 40 in such a manner that it matches with the uneven structure on the surface of the uneven structure layer 20. In the structures of FIGS. 1 and 2, since the uneven structure layer 20 is provided, the uneven structure is also introduced into the anode and the luminescent layer in addition to the surface of the cathode 30. The introduction of the uneven structure enhances the light scattering at the interface between those layers and enables a higher light extraction efficiency.

The translucent substrate 60 is required to be highly transparent and also to be a sufficient barrier in order to prevent deterioration of the luminescent layer 40. Thus, in general, the translucent substrate 60 is a glass substrate, although it is not limited to this. Materials for forming the translucent substrate 60 may include glass, various plastics, and silicon. The translucent substrate 60 may be a single layer or a laminated structure including a plurality of layers. Preferably, the translucent substrate 60 has a thickness of 0.1 mm to 1 mm.

The uneven structure layer 20 can be formed using a thermosetting resin, an oxidation polymerization resin, a reaction curable resin, an ultraviolet curable resin, an electron beam curable resin, a thermoplastic resin, or the like. In order to facilitate formation of the uneven structure, preferably, an ultraviolet curable resin or an electron beam curable resin is used. Alternatively, the uneven structure layer 20 may be formed using the so-called "positive type" photoresist whose solubility to a developer increases at parts irradiated with actinic radiation such as ultraviolet radiation.

The anode 50 is formed using a material having high transparency and conductivity. The anode 50 may be made of an inorganic conductive film such as indium tin oxide (ITO), indium zinc oxide (IZO), ZnO, CuI, and $SnO_2$, an organic conductive film such as a mixture of polyethylene dioxythiophene and polystyrene sulfonic acid (PEDOT/PSS), or a composite conductive film such as a silver nanowire ink formed by dispersing silver nanowires in a polymer material, but it is not limited to these. Depending on the properties of the material used, the anode 50 can be formed by any method known in the art, such as vapor deposition, spin coating, casting, ink jetting, and printing.

The luminescent layer 40 is formed using an arbitrary low molecular weight material and/or an arbitrary polymer material known in the art. The luminescent layer 40 may be a single layer or a laminated structure including a plurality of layers, provided that it includes at least one layer having a luminescent function ("luminescent layer" in the narrow sense). The luminescent layer 40 may include a hole injecting layer, a hole transporting layer, an electron transporting layer, and/or an electron injecting layer in addition to the luminescent layer in the narrow sense. Depending on the properties of the material used, the luminescent layer 40 can be formed by any method known in the art, such as vapor deposition, spin coating, casting, ink jetting, and printing.

The cathode 30 is formed using a reflective metal material. Reflective metal materials that can be used include aluminum, silver, and the like.

Figure 3A:
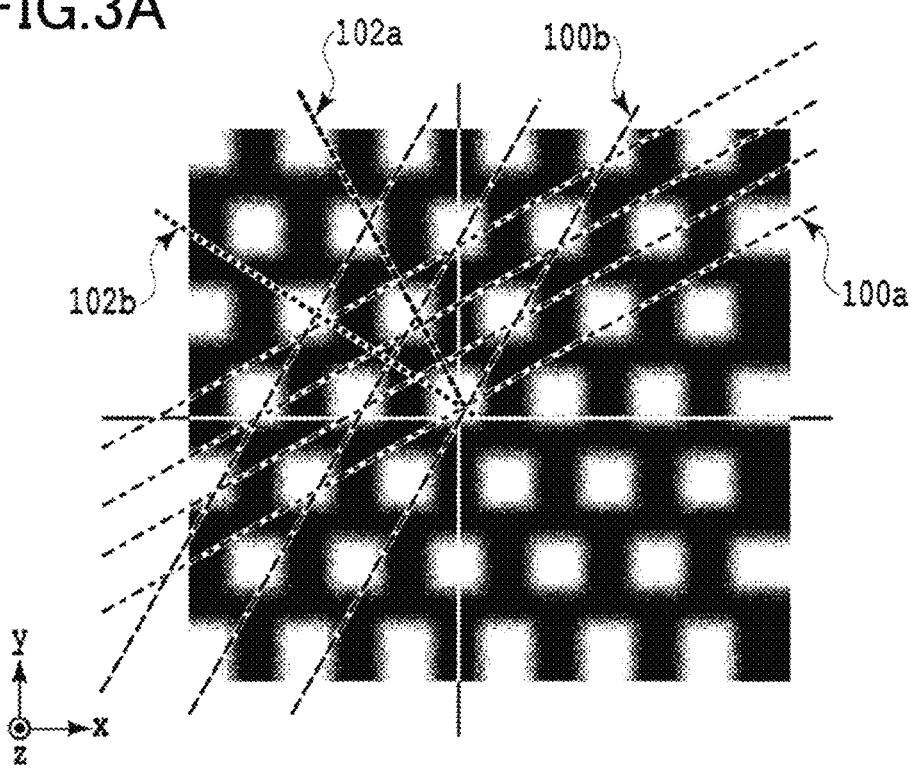
FIG. 3A shows a top view of a periodically arranged uneven structure.

FIG. 3A shows a top view of a prior art cathode with a periodically arranged uneven structure. In FIG. 3A, the protrusions are shown in black, and the recesses are shown in white. Even if the black parts are protrusions and the white parts are recesses, a similar optical effect can be obtained. The recesses of FIG. 3A have a quadrangular shape and are periodically arranged in a staggered manner. However, recesses or protrusions having another shape such as a circle, an ellipse, and a polygon may by periodically arranged and still provide the effect of suppressing loss of light due to surface plasmon absorption. The recesses or protrusions may be arranged in a square matrix without being staggered. Alternatively, a slight randomness may be imparted to the above-mentioned staggered array or square matrix array.

Such a periodic uneven structure has some effects on suppressing surface plasmon absorption. In order to verify the periodicity, the Fourier transform of the structure of FIG. 3A is calculated, resulting in the two-dimensional frequency spectrum of FIG. 3B. Specifically, regarding the depth f(x, y) of a recess at coordinates (x, y) in FIG. 3A, F(u, v) is determined by the following equation using the spatial frequency component in the x-axis direction u and the spatial frequency component in the y-axis direction v. In the following equation, the larger the number of samples in the x direction M and the number of samples in the y direction N, the more accurately the structure can be represented. Using the sampling theorem with respect to the unit frequency width of a pair of a protrusion and a recess of the structure, in each of the x direction and the y direction, the interval of the sampling points is set to be not greater than half of the unit frequency width.

Equation 2

$$F(u, v) = \sum_{u=0}^{M-1} \sum_{v=0}^{N-1} f(x, y) \exp\left(-2\pi j \left(\frac{ux}{M} + \frac{vy}{N}\right)\right)$$

Figure 3B:
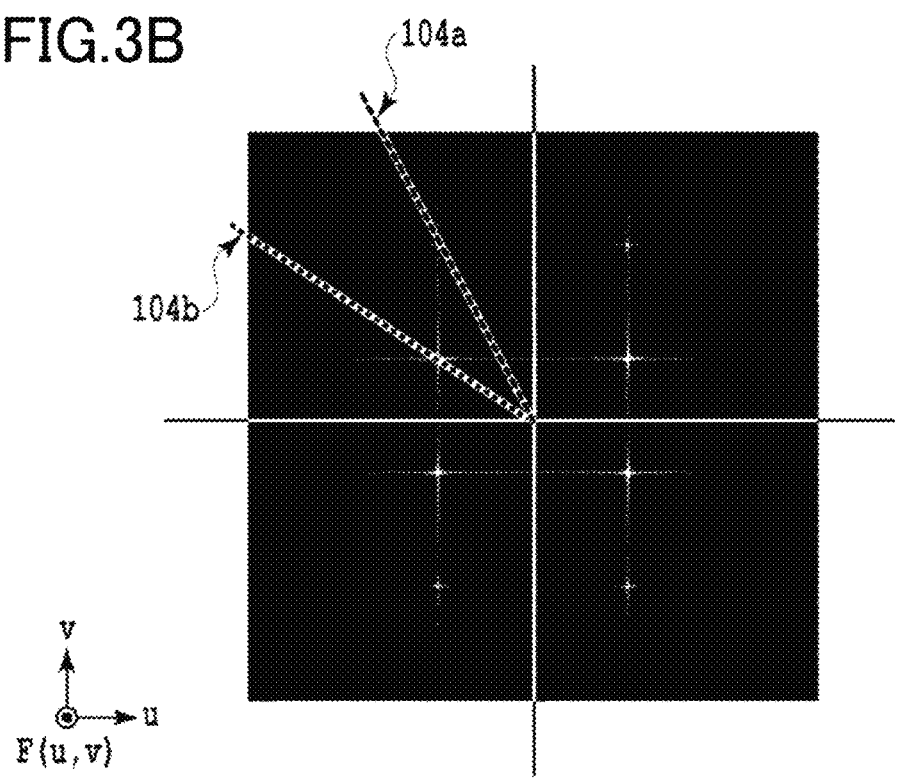
FIG. 3B shows the Fourier transform image of the uneven structure of FIG. 3A.

FIG. 3B shows a general Fourier transform image in which the center of the graph is the origin where u=0 and v=0, and the absolute values of the spatial frequencies u and v increase further from the center. The spatial frequency v can be obtained by the equation $v=(u^2+v^2)^{1/2}$.

The array of recesses indicated by line 100a in FIG. 3A has periodicity in the direction indicated by line 102a and a spatial frequency in the direction indicated by line 104a in FIG. 3B. On the other hand, the array of recesses indicated by line 100b in FIG. 3A has periodicity in the direction indicated by line 102b and a spatial frequency in the direction indicated by line 104b in FIG. 3B. As described above, it can be understood that the uneven structure of FIG. 3A has periodicity in the directions from the center to the bright points in the image of FIG. 3B. It is known to make the spatial frequency $(u^2+v^2)^{1/2}$ at the positions indicated by the white points in FIG. 3B with the spatial frequency v for suppressing surface plasmon absorption obtained by the following formula (I) so as to reconvert the generated surface plasmons to light and suppress surface plasmon absorption.

Equation 3

$$v = \frac{1}{\lambda} \times \mathrm{Re}\left(\sqrt{\frac{\varepsilon_1 \times \varepsilon_2}{\varepsilon_1 + \varepsilon_2}}\right) \quad \text{(I)}$$

(wherein $\varepsilon_1$ is the relative permittivity of the luminescent layer, $\varepsilon_2$ is the relative permittivity of the cathode, Re( ) is a function for extracting the real part of the complex number, and $\lambda$ is the central wavelength of the emission spectrum of the luminescent layer)

However, the directions effective for suppressing surface plasmon absorption are only those directions in which the uneven structure has periodicity, and only those directions connecting the center and the bright spots of the image in FIG. 3B.

Figure 4:
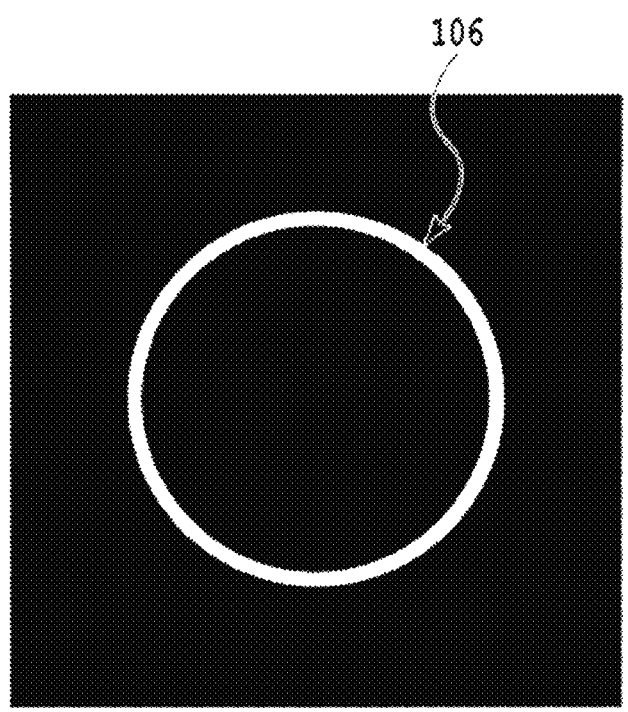
FIG. 4 shows a two-dimensional spatial frequency spectrum including only a spatial frequency optimum for converting surface plasmons to light.
Figure 4:
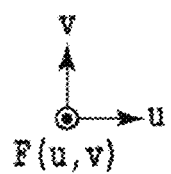
Figure 5:
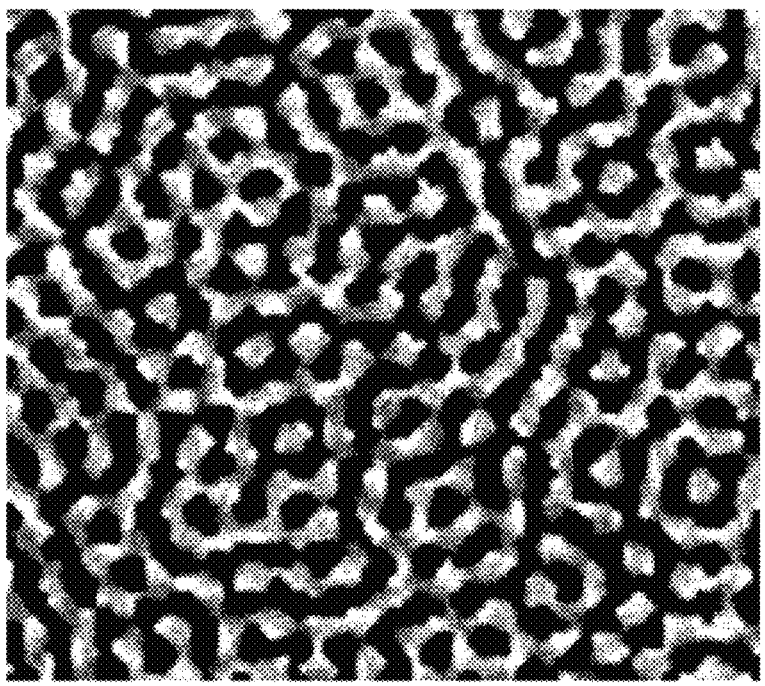
FIG. 5 is a schematic top view showing an uneven structure calculation value obtained by inverse Fourier transformation of the two-dimensional spatial frequency spectrum shown in FIG. 4.
Figure 5:
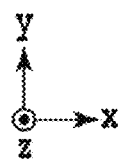

As another method, it has been proposed to use an annular two-dimensional spatial frequency spectrum shown in FIG. 4 (see PTL 2). When the two-dimensional spatial frequency spectrum 106 in FIG. 4 is subjected to inverse Fourier transformation, the uneven structure shown in FIG. 5 is obtained. Similarly in FIG. 5, the protrusions are shown in black, and the recesses are shown in white. The cathode with the uneven structure shown in FIG. 5 provides a high light extraction effect (an effect of suppressing surface plasmon absorption) in every direction, but matching it with an uneven light extraction film placed outside the translucent substrate 60 is a problem.

Figure 6A:
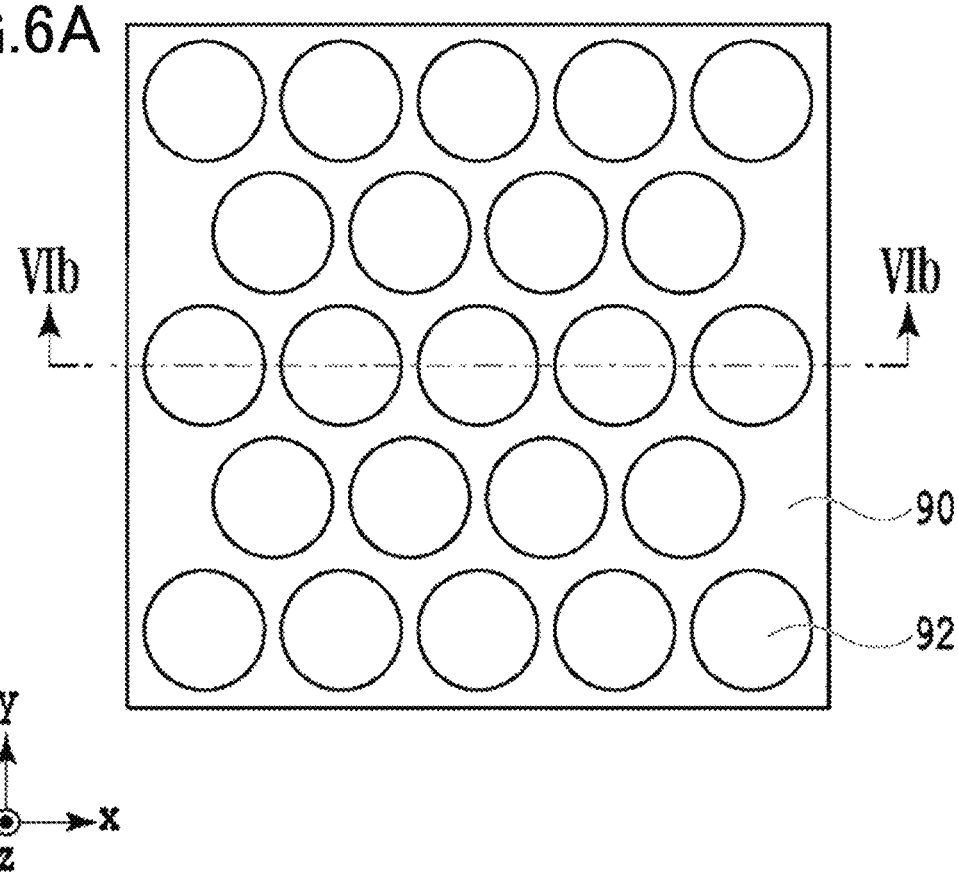
FIG. 6A is a schematic top view showing a configuration example of a prism structure including hemispherical protrusions.
Figure 6B:
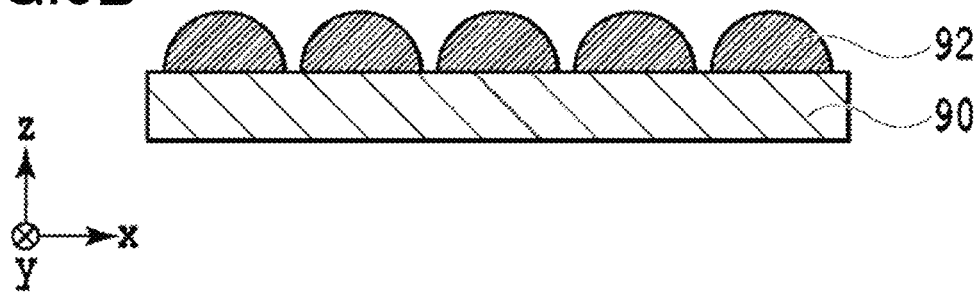
FIG. 6B is a schematic cross-sectional view along the cutting line VIb-VIb of the configuration example of a prism structure including hemispherical protrusions.
Figure 7A:
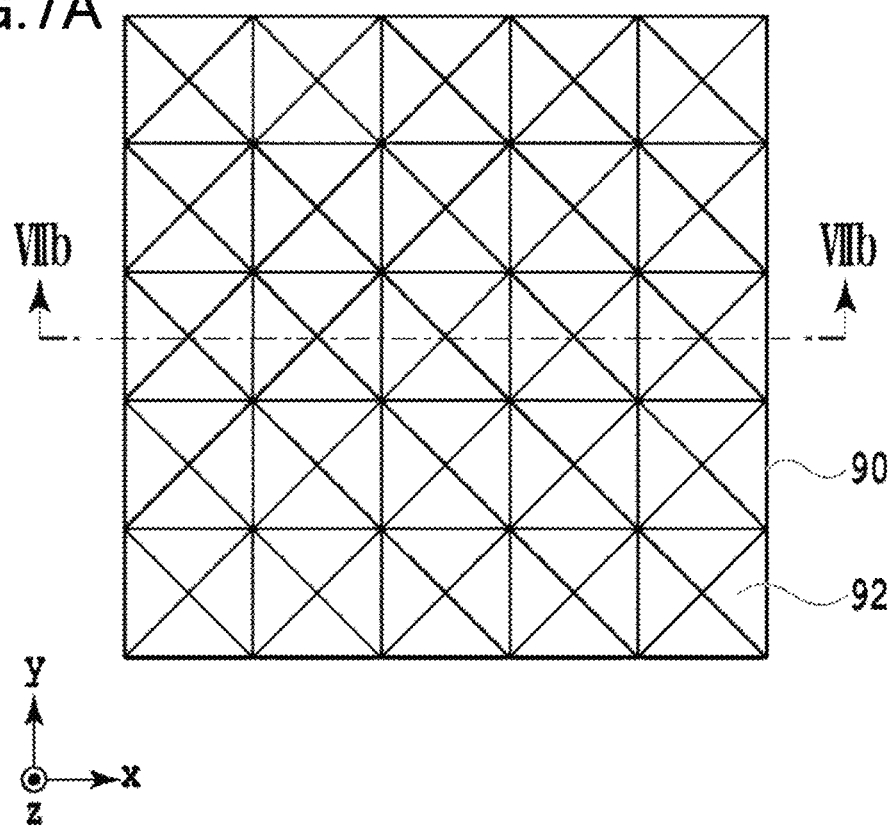
FIG. 7A is a schematic top view showing a configuration example of a prism structure including quadrangular pyramid recesses.
Figure 7B:
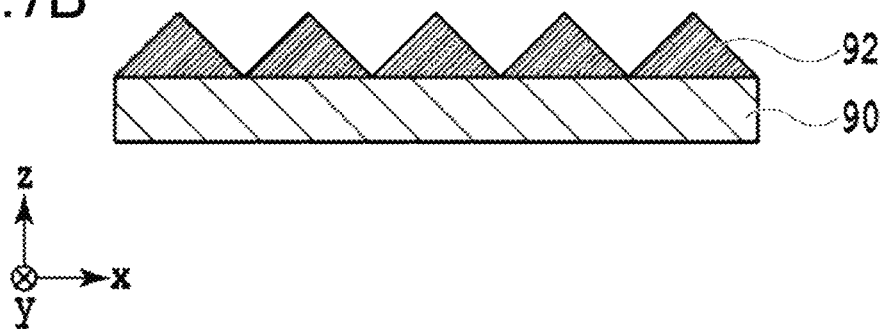
FIG. 7B is a schematic cross-sectional view along the cutting line VIIb-VIIb of the configuration example of a prism structure including quadrangular pyramid recesses.

FIGS. 6A, 6B, 7A, and 7B show typical structures of uneven light extraction films. FIGS. 6A and 6B show a top view and a cross-sectional view of an uneven light extraction film provided with hemispherical protrusions 92 on a transparent support 90. FIGS. 7A and 7B show a top view and a cross-sectional view of an uneven light extraction film provided with quadrangular pyramid recesses 92 on a transparent support 90. In FIGS. 6A, 6B, 7A, and 7B, configuration examples in which protrusions or recesses are arranged regularly are shown. However, the protrusions or recesses may be randomly arranged.

A flat surface is likely to cause total reflection at the interface between the transparent support 90 and the air and produce loss of light. Thus, the light extraction efficiency can be improved by providing an uneven form like those shown in FIGS. 6A, 6B, 7A, and 7B.

Figure 8A:
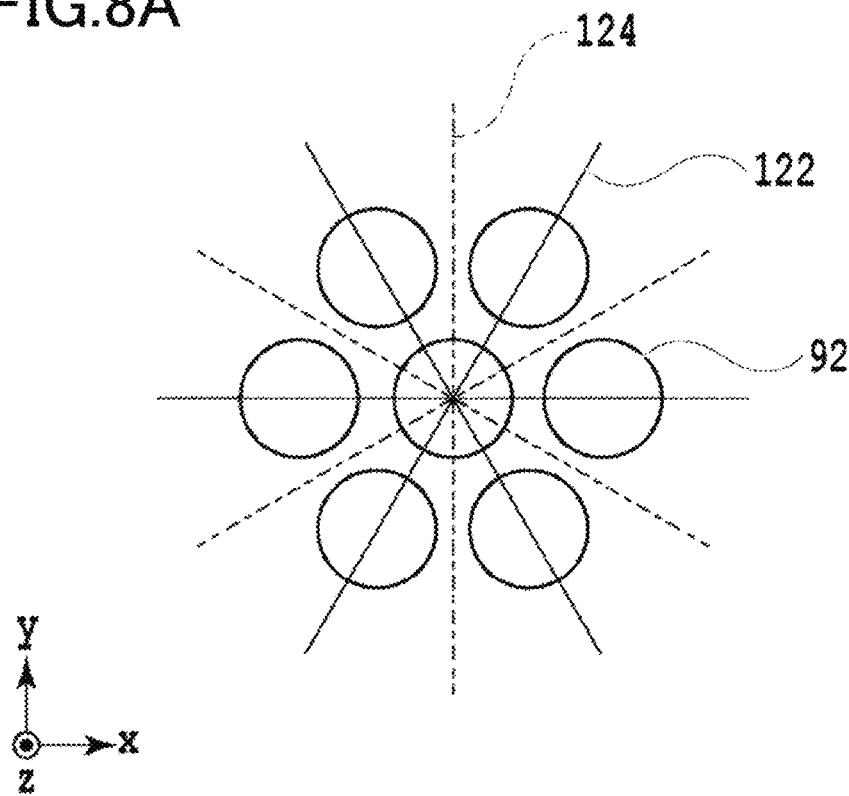
FIG. 8A is a schematic top view showing light extraction easy directions and light extraction difficult directions of the prism structure including hemispherical protrusions.
Figure 8B:
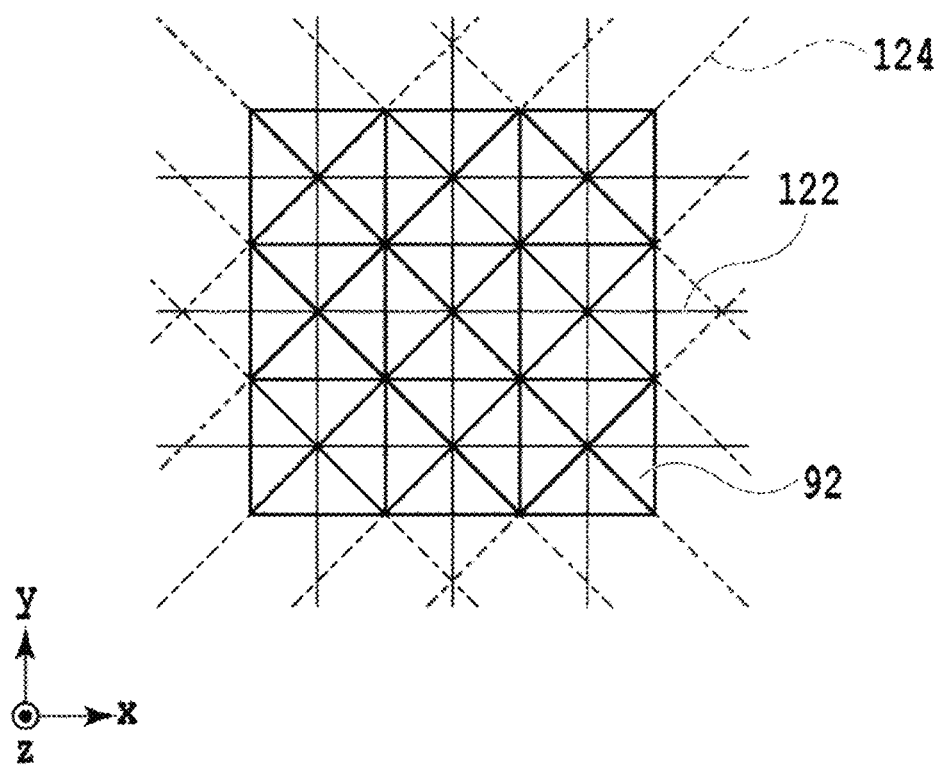
FIG. 8B is a schematic top view showing light extraction easy directions and light extraction difficult directions of the prism structure including quadrangular pyramid recesses.

As shown in FIGS. 5, 6A, and 6B, the shape and arrangement of the protrusions or recesses can be changed variously. However, depending on the shape and/or arrangement, there may be directions in which light extraction is easy and directions in which light extraction is difficult. In the configuration example in which hemispherical protrusions are arranged as shown in FIGS. 6A and 6B, a flat surface is inevitably produced, and the light extraction efficiency becomes lower than that of the configuration example in which quadrangular pyramid recesses are arranged as shown in FIGS. 7A and 7B. FIG. 8A shows directions 122 in which light extraction is easy and directions 124 in which light extraction is difficult of the configuration example in which hemispherical protrusions are arranged shown in FIGS. 6A and 6B. On the other hand, FIG. 8B shows directions 122 in which light extraction is easy and directions 124 in which light extraction is difficult of the configuration example in which quadrangular pyramid recesses are arranged shown in FIGS. 7A and 7B.

Figure 9A:
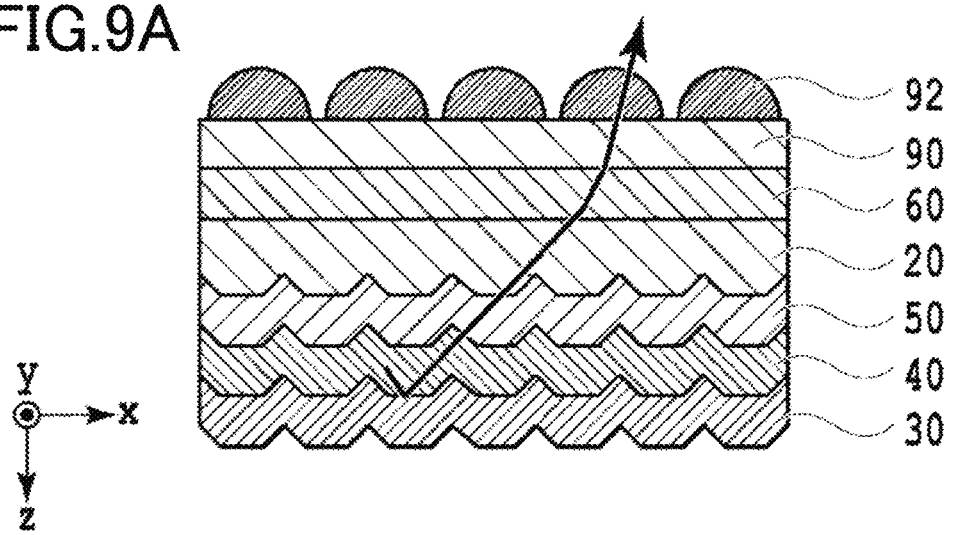
FIG. 9A shows the behaviour of light in the light extraction easy direction of the organic EL (electroluminescent) device having the prism structure including hemispherical protrusions.
Figure 9B:
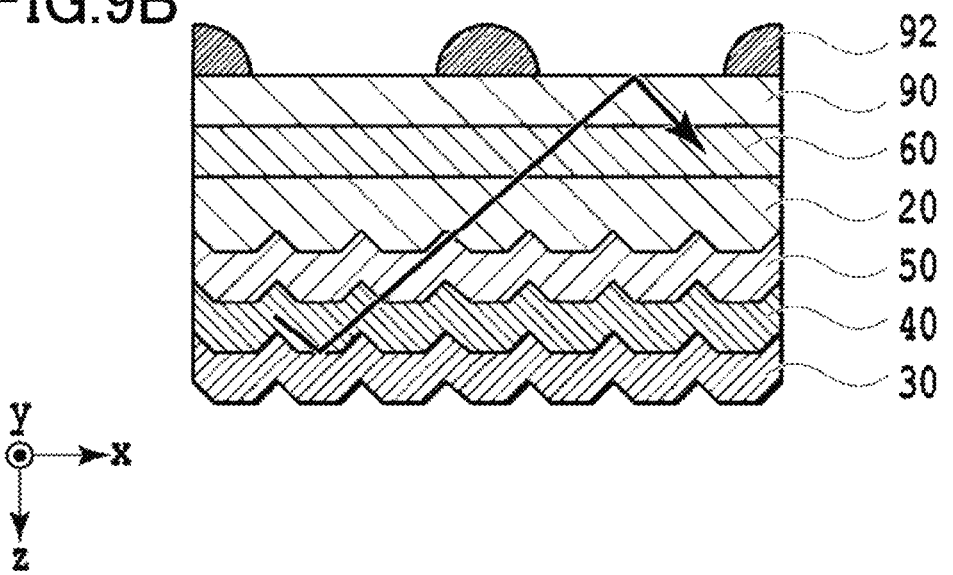
FIG. 9B shows the behaviour of light in the light extraction difficult direction of the organic EL (electroluminescent) device having the prism structure including hemispherical protrusions.

FIGS. 9A and 9B show the behavior of light in the case where hemispherical protrusions are provided as shown in FIGS. 6A and 6B. FIG. 9A shows a cross section along the direction 122 in which light extraction is easy. In this cross section, light emitted under suppressed surface plasmon absorption by the unevenness of the cathode can be extracted to the outside by passing through the hemispherical protrusion 92. FIG. 9B shows a cross section along the direction 124 in which light extraction is difficult. In this cross section, the density of the hemispherical protrusions 92 is small, and the probability of total reflection at the flat surface of the transparent support 90 increases. Thus, even if the surface plasmon absorption is suppressed by the unevenness of the cathode, the efficiency of extracting light emitted from the luminescent layer to the outside is reduced.

For example, the directions 122 in which light extraction is easy and the directions 124 in which light extraction is difficult of the uneven light extraction film can be determined by measuring the orientation angle of the external emitted light of the organic EL (electroluminescent) device using a spectral radiance meter (for example, TOPCON-SR3AR manufactured by TOPCON TECHNOHOUSE CO., LTD.). First, the orientation angle of the light inside the organic EL (electroluminescent) device is measured by bringing the cylindrical lens into close contact with the surface of the transparent support 90 where there is no uneven structure and measuring the orientation angle. To make the cylindrical lens closely contact, a liquid with a refractive index that is close to that of the materials of the transparent support 90 and the cylindrical lens is used (for example, 1.52 in case of glass). Next, the orientation angle of light extracted to the outside is measured by attaching the uneven light extraction film having the uneven structure to the surface of the transparent support and measuring the orientation angle. Comparing the orientation angles of the internal light and external light, the directions 122 in which light extraction is easy and the directions 124 in which light extraction is difficult can be determined. Alternatively, the directions 122 in which light extraction is easy and the directions 124 in which light extraction is difficult direction may be determined by ray tracing optical simulation. In this case, both directions can be determined without performing the above-described measurement.

The organic EL (electroluminescent) device of the present invention includes a translucent substrate having a first surface and a second surface; a transparent electrode, a cathode, and a luminescent layer provided between the transparent electrode and the cathode which are formed over the first surface; and a light extraction film having unevenness placed on the second surface, wherein the cathode has a plurality of recesses or protrusions on the surface thereof facing the luminescent layer, and the Fourier transform image of the surface of the cathode facing the luminescent layer includes one or more surface plasmon absorption suppression areas including a spatial frequency v obtained by Equation (I) and one or more light scattering areas not including a spatial frequency that is equal to or greater than the spatial frequency v.

Equation 4

$$v = \frac{1}{\lambda} \times \mathrm{Re}\left(\sqrt{\frac{\varepsilon_1 \times \varepsilon_2}{\varepsilon_1 + \varepsilon_2}}\right) \quad \text{(I)}$$

(wherein $\varepsilon_1$ is the relative permittivity of the luminescent layer, $\varepsilon_2$ is the relative permittivity of the cathode, Re( ) is a function for extracting the real part of the complex number, and λ is the central wavelength of the emission spectrum of the luminescent layer)

In the present invention, an "area including the spatial frequency v" indicates that, for all of the spatial frequencies v in that area, the value of F(u, v) is no less than a threshold Th. An "area not including the spatial frequency v" indicates that, for all of the spatial frequencies v in that area, the value of F(u, v) is smaller than the threshold Th. The threshold Th may be 10% or greater, preferably 50% or greater of the maximum value of F(u, v) in the entire Fourier transform image.

Figure 10:
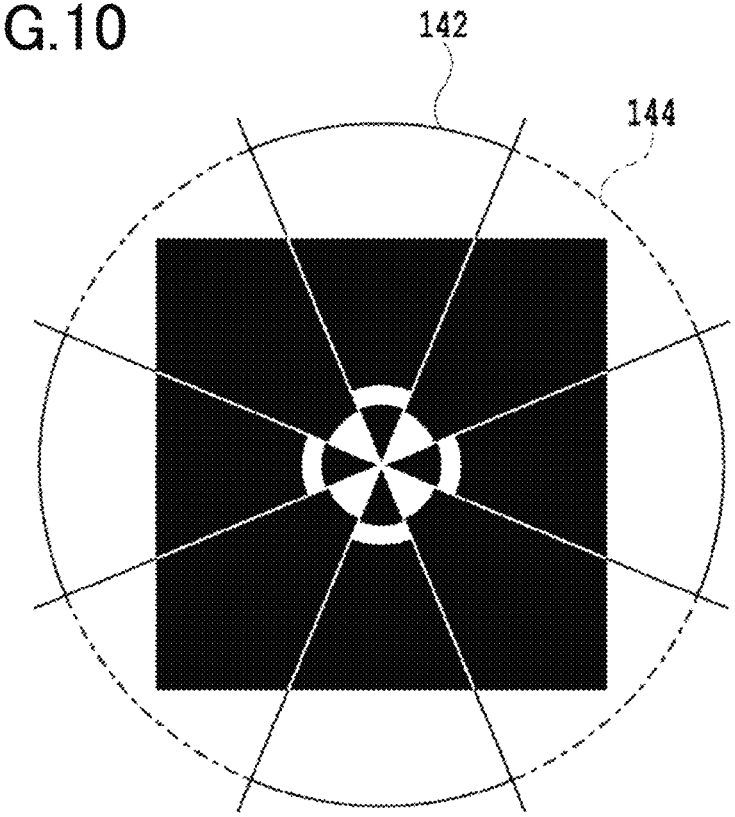
FIG. 10 is a schematic top view showing a two-dimensional spatial frequency spectrum that is optimum for use in the present invention, and the distribution of the surface plasmon absorption suppression areas and the light scattering areas of this spectrum.
Figure 10:
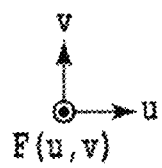
Figure 11A:
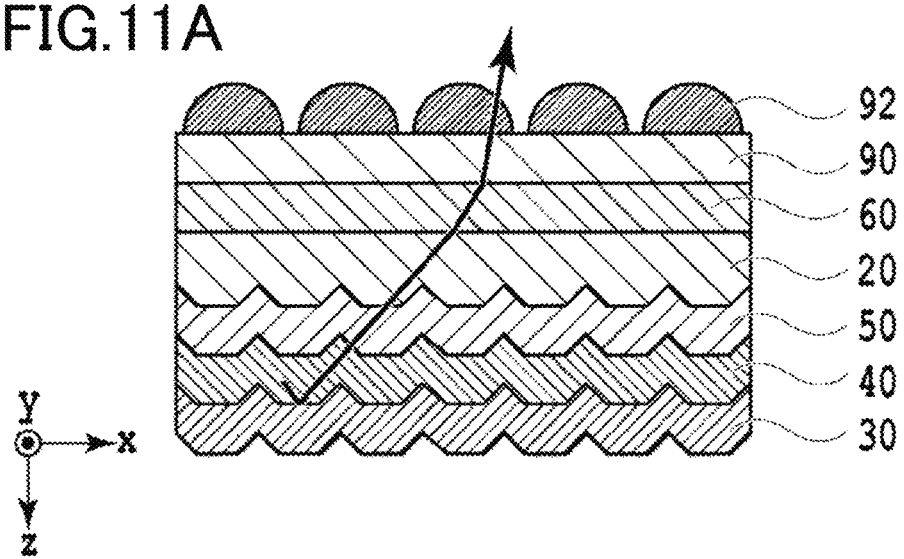
FIG. 11A shows the behaviour of light in the surface plasmon absorption suppression area of the organic EL (electroluminescent) device of Example 1.
Figure 11B:
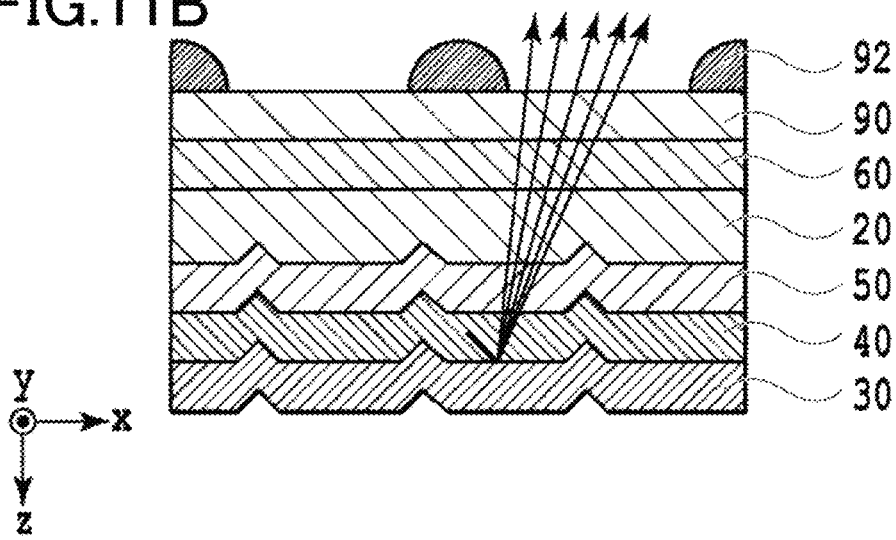
FIG. 11B shows the behaviour of light in the light scattering area of the organic EL (electroluminescent) device of Example 1.

One example of the Fourier transform image of the cathode of the present invention is shown in FIG. 10. The example of the Fourier transform image shown in FIG. 10 is divided into eight sector areas whose center is at the origin (u, v)=(0, 0). Four areas that are not adjacent to each other are surface plasmon absorption suppression areas 142 including the spatial frequency v obtained from Equation (I). The other four areas are light scattering areas 144 which do not include spatial frequencies equal to or greater than the spatial frequency v obtained from Equation (I). In other words, the spatial frequency represented by the surface plasmon absorption suppression area 142 is used as the spatial frequency of the uneven structure in the direction 122 in which light extraction is easy of the uneven light extraction film, so that, as shown in FIG. 11A, light generated by reconversion of surface plasmons can be externally extracted. On the other hand, in the direction 124 in which light extraction is difficult of the uneven light extraction film, even if light is generated by reconversion of surface plasmons, it is difficult to extract the light to the outside due to total reflection at the surface of the uneven light extraction film. To approach this, the spatial frequency represented by the light scattering area 144 is used as the spatial frequency of the uneven structure in the direction 124 in which light extraction is difficult of the uneven light extraction film, so that, as shown in FIG. 11B, light emitted from the luminescent layer and reflected at the cathode is scattered, whereby total reflection at the surface of the uneven film is suppressed and more light can be extracted outside.

Figure 12:
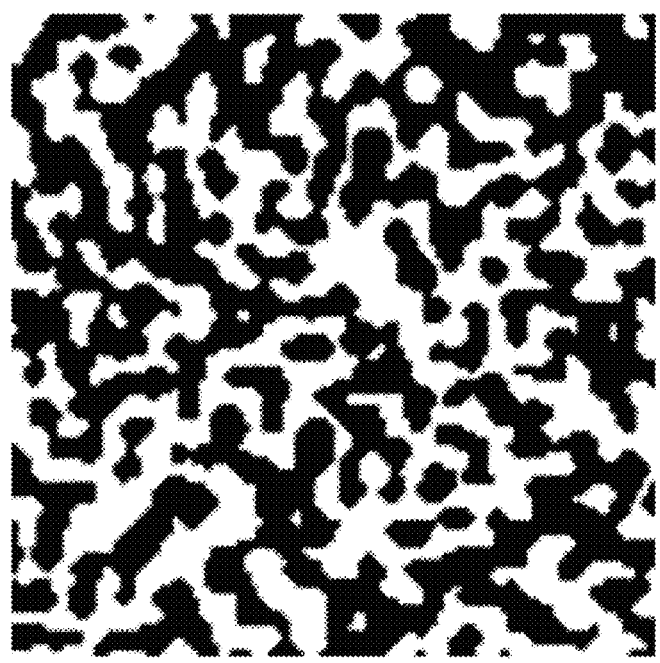
FIG. 12 is a schematic top view showing an uneven structure calculation value obtained by inverse Fourier transformation of the two-dimensional spatial frequency spectrum shown in FIG. 10.

FIG. 12 shows a surface uneven structure of the cathode obtained by inverse Fourier transformation of the Fourier transform image shown in FIG. 10. In the present invention, the inverse Fourier transformation determines the depth f(x, y) of the recesses wherein the variables are coordinates (x, y) using the following equation with respect to F(u, v) at the spatial frequency component u in the x-axis direction and the spatial frequency component v in the y-axis direction.

Equation 5

$$f(x, y) = \frac{1}{MN} \sum_{u=0}^{M-1} \sum_{v=0}^{N-1} F(u, v) \exp\left(2\pi j\left(\frac{ux}{M} + \frac{vy}{N}\right)\right)$$

The uneven structure can be created on a resist by drawing the image data for the uneven structure obtained by the inverse Fourier transformation on the resist using, for example, an electron beam drawing device and then developing it. The uneven structure formed on the resist may be directly used as the uneven structure layer 20. However, mass productivity can be improved by preparing an electrotype from the uneven structure and transferring the uneven structure of the electrotype to a resin film. The transfer from the electrotype to the resin film can be carried out roll-to-roll by winding the electrotype around a roll and pressing the electrotype against a resin film on a roll film such as PET. A resin film made of a thermosetting resin or an ultraviolet curable resin may be used and the resin film may be cured by heating or ultraviolet irradiation.

The spatial frequency v included in the surface plasmon absorption suppression area 142 may be determined using the emission spectrum of the luminescent layer and a variable k which determines the ratio of coverage of the emission spectrum. For example, let $\lambda_p$ be the peak wavelength of the emission spectrum of the luminescent layer, S(λ) be the intensity at wavelength λ, $\lambda_{min}$ be the minimum wavelength that satisfies $S(\lambda) > S(\lambda_p)/100$, $\lambda_{max}$ be the maximum wavelength that satisfies $S(\lambda) > S(\lambda_p)/100$, and k be a real number greater than 0.8. The spatial frequency $v_1$ is obtained by substituting $\lambda_1$ obtained from $$\lambda_1 = k \times \lambda_{min} \tag{II}$$

into λ in Eq. (I), and the spatial frequency $v_2$ is obtained by substituting $\lambda_2$ obtained from $$\lambda_2 = (1/k) \times \lambda_{max} \tag{III}$$

into λ in Equation (I). The value of k is adjusted so that $\lambda_1 < \lambda_2$ is satisfied. The surface plasmon absorption suppression area 142 may include spatial frequencies $v_2$ or greater to $v_1$ or less. Determining the range of spatial frequencies included in the surface plasmon absorption suppression area 142 on the basis of the emission spectrum S(λ) of the luminescent layer, it is possible to efficiently suppress the surface plasmon absorption at the surface of the cathode 30.

The value of k was changed from 0.5 to 1.2 (8 levels) in Equation (II) and Equation (III) and 8 pairs of ($v_1$, $v_2$) were obtained. Then, the uneven structure was calculated by inverse Fourier transformation of the two-dimensional spatial frequency spectrum of FIG. 4 (out of the scope of the present invention) wherein the spatial frequency of the inner circumference of the white part is $v_2$ and the spatial frequency of the outer circumference is $v_1$. Here, the maximum height of the uneven structure (the distance in the z direction between the lowest point and the highest point of the uneven surface) is 50 nm. Further, on the translucent substrate 60, an uneven structure layer 20 having the uneven structure obtained by the above calculation was formed. On the uneven structure layer 20, an anode 50 made of indium tin oxide (ITO) having a film thickness of 50 nm, a luminescent layer 40 including a 4,4'-bis(N-(1-naphthyl)-N-phenylamino) biphenyl (α-NPD) film having a film thickness of 70 nm and a tris (8-quinolinolato) aluminum ($Alq_3$) film having a film thickness of 60 nm, and a cathode 30 made of aluminum having a film thickness of 100 nm were laminated. Thus, the organic EL (electroluminescent) device shown in FIG. 2 was formed.

The greater the height of the uneven structure on the surface of the uneven structure layer 20, the better the optical characteristics. However, increase in the height of the uneven structure increases the risk of short circuit between the cathode 30 and the anode 50 in the organic EL (electroluminescent) device Although it depends on the device structure, it is preferable that the height of the uneven structure at the surface of the uneven structure layer 20 is about 20 nm to about 100 nm.

Figure 13:
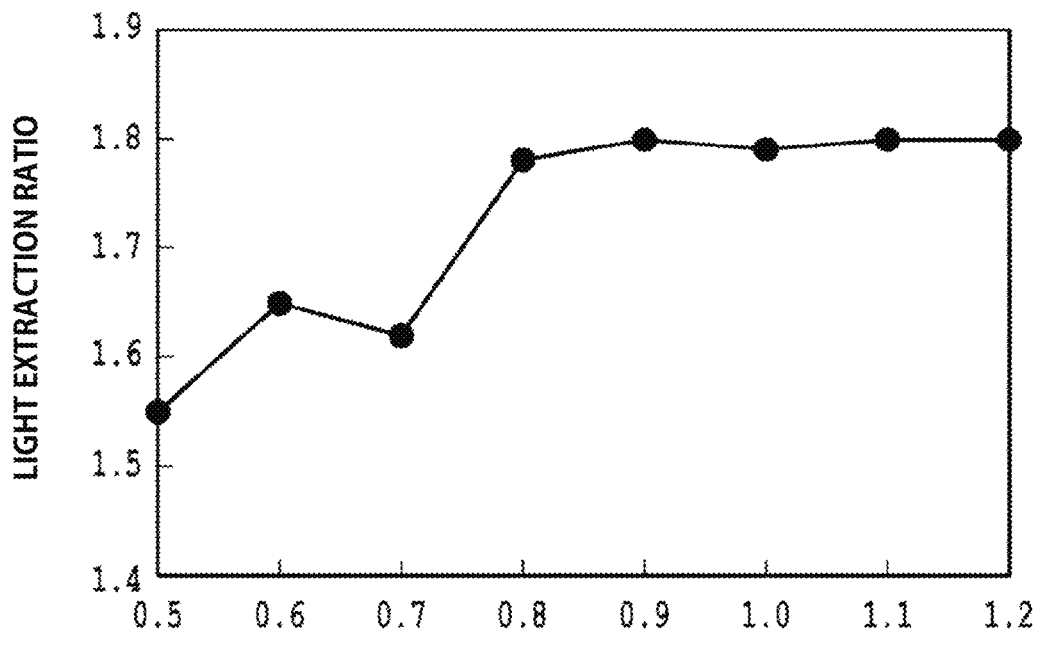
FIG. 13 is a graph showing the relationship between the coefficient k of Equation (II) and Equation (III) and the light extraction efficiency.

Assuming that the total luminous flux extracted to the outside from the organic EL (electroluminescent) device fabricated without forming the uneven structure layer 20 is 1.0, the light extraction ratio of the organic EL (electroluminescent) device was measured. The results are shown in FIG. 13. As can be seen from FIG. 13, when k=0.5 to 0.7, the light extraction ratio is low, and when k is equal to or greater than 0.8, the light extraction ratio is improved. Increase in the value of k means reduction in the width of the white part in FIG. 4. Accordingly, it can be understood that it is effective for improving the light extraction efficiency of the organic EL (electroluminescent) device if the width of spatial frequencies v included in the surface plasmon absorption suppression area 142 is smaller than a particular value.

Figure 14:
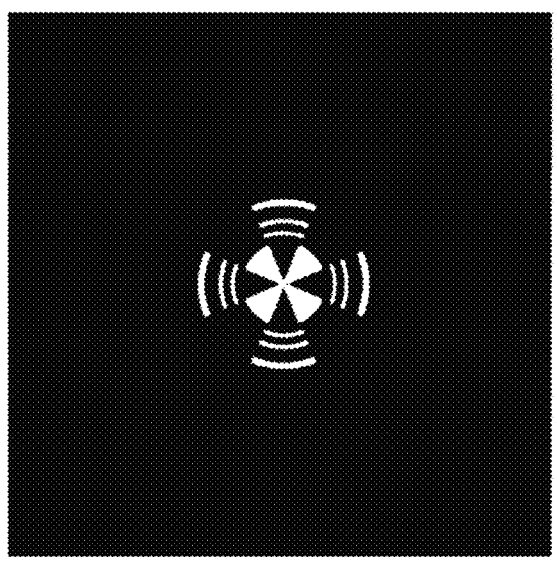
FIG. 14 shows an example of a two-dimensional spatial frequency spectrum suitable for improving the light extraction efficiency of a white organic EL (electroluminescent) device.
Figure 14:
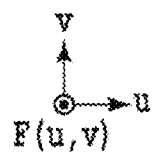

Similarly, regarding a white light emitting organic EL (electroluminescent) device in which the luminescent layer has an emission spectrum including red (R), green (G) and blue (B) components, if a cathode having the uneven structure obtained by inverse Fourier transformation of the spatial frequency spectrum including spatial frequencies $v_{p1} \ldots v_{pn}$ obtained by substituting the emission peak wavelengths $\lambda_{p1} \ldots \lambda_{pn}$ of the respective components into $\lambda$ in Equation (I), light extraction efficiency can be improved by suppressing surface plasmon absorption. FIG. 14 shows an example of a spatial frequency spectrum including $v_{pR}$, $v_{pG}$, and $v_{pB}$ corresponding to the three components R, G, and B. When a luminescent layer emitting a plurality of components is used, only the surface plasmon absorption of a particular component can be suppressed by adopting a two-dimensional spatial frequency spectrum including a spatial frequency corresponding to the peak wavelength of the particular component. In such case, the shape of the emission spectrum of the external emitted light can be changed by adjusting the light extraction efficiency of each component. Changing the shape of the emission spectrum is effective for adjusting the color rendering index and/or the color temperature of the organic EL (electroluminescent) device.

Figure 15A:
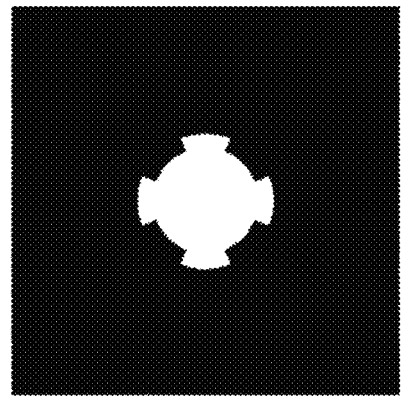
FIG. 15A shows an example of a two-dimensional spatial frequency spectrum that can be used to obtain the uneven structure of the organic EL (electroluminescent) device of the present invention.
Figure 15B:
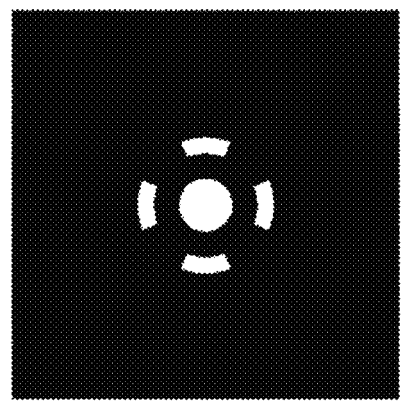
FIG. 15B shows an example of a two-dimensional spatial frequency spectrum that can be used to obtain the uneven structure of the organic EL (electroluminescent) device of the present invention.
Figure 15C:
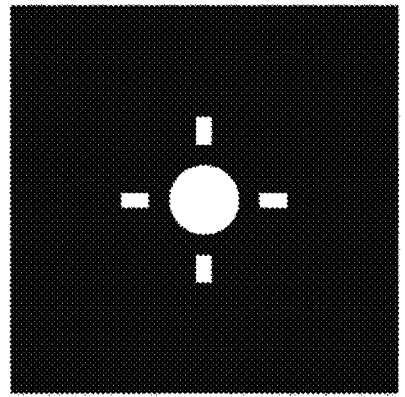
FIG. 15C shows an example of a two-dimensional spatial frequency spectrum that can be used to obtain the uneven structure of the organic EL (electroluminescent) device of the present invention.
Figure 15D:
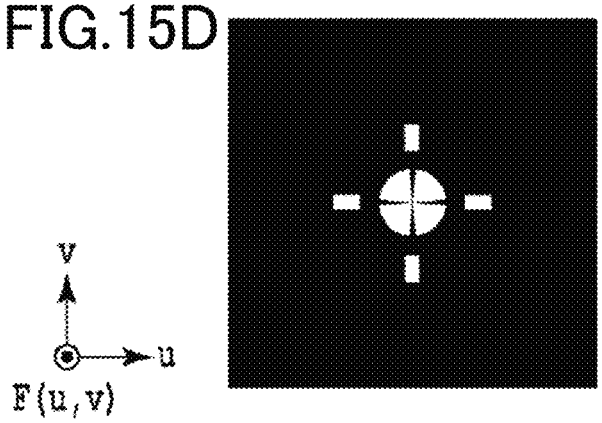
FIG. 15D shows an example of a two-dimensional spatial frequency spectrum that can be used to obtain the uneven structure of the organic EL (electroluminescent) device of the present invention.

FIGS. 15A to 15D show other examples of the Fourier transform image of the uneven structure of the cathode which can be used in the present invention. FIG. 15A shows a variation in which the surface plasmon absorption suppression area 142 of the Fourier transform image shown in FIG. 10 includes spatial frequencies smaller than the spatial frequency v that contribute to scattering, in addition to the spatial frequency v obtained by Equation (I). FIG. 15B shows a variation in which, in the Fourier transform image of FIG. 15A, the upper limit of the spatial frequencies in the light scattering area 144 is decreased and the upper limit of the spatial frequencies contributing to scattering in the surface plasmon absorption suppression area 142 is decreased. FIG. 15C shows a variation in which, in the Fourier transform image shown in FIG. 15B, the shape of the surface plasmon absorption suppression region 142 is changed from a sector to a rectangle formed having sides parallel to the u axis and the y axis. FIG. 15D shows a variation in which, in the Fourier transform image of FIG. 15C, the sector area whose center is at the origin (u, v)=(0, 0) is removed in the area of spatial frequencies contributing to scattering in the surface plasmon absorption suppression area 142.

Figure 16A:
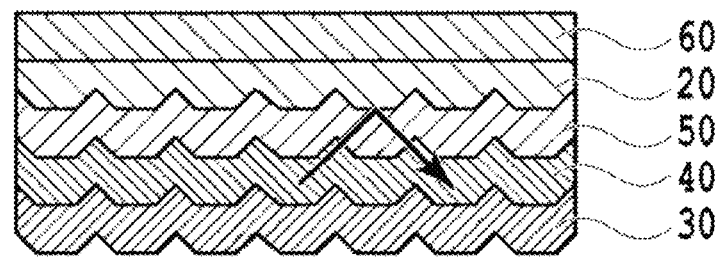
FIG. 16A is a schematic cross-sectional view showing the behavior of light at the interface between the uneven structure having a low refractive index and the transparent electrode.
Figure 16A:
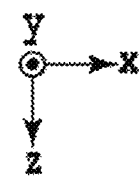
Figure 16B:
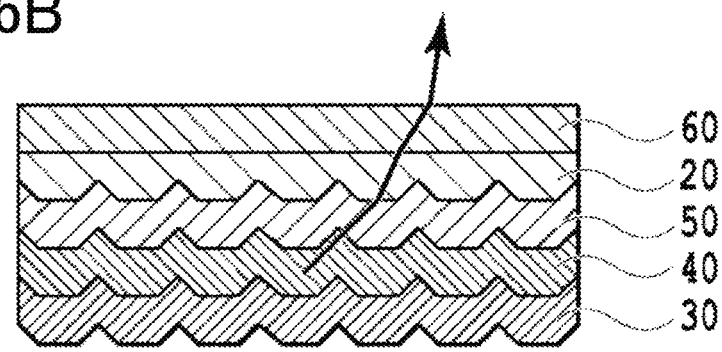
FIG. 16B is a schematic cross-sectional view showing the behavior of light at the interface between the uneven structure having a high refractive index and the transparent electrode.
Figure 16B:
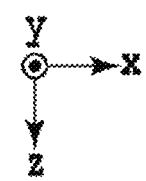

With respect to the light emitted from the luminescent layer 40 toward the cathode 30, the structure for suppressing surface plasmon absorption described above is effective. On the other hand, as for the light emitted from the luminescent layer toward the anode 50 and the translucent substrate 60, since it is not incident on the cathode 30, loss of light due to surface plasmon absorption is small. However, when the uneven structure layer 20 has a refractive index around that of a general resin, i.e., around 1.5, as shown in FIG. 16A, loss may occur due to total reflection at the interface between the uneven structure layer 20 and the anode 50. Thus, preferably, the refractive index of the uneven structure layer 20 is equal to or greater than 1.7. In such case, as shown in FIG. 16B, total reflection at the interface between the uneven structure layer 20 and the anode 50 can be suppressed, and light from the luminescent layer can be extracted to the outside. The refractive index of the uneven structure layer 20 may be adjusted using $ZrO_2$ or $TiO_2$ fine particles. In such case, the $ZrO_2$ fine particles and $TiO_2$ fine particles only serve to adjust the refractive index and barely serve to scatter light. In addition, the diameter of these fine particles is in the order of nanometer, and they can be distinguished from light scattering fine particles.

The uneven structure was calculated by inverse Fourier transformation of the two-dimensional spatial frequency spectrum of FIG. 4 (out of the scope of the present invention) including a spatial frequency of $\frac{1}{282}$ $nm^{-1}$. On the translucent substrate 60, an uneven structure layer 20 having the uneven structure obtained by the above calculation was formed using a material whose refractive index is adjusted by adding $ZrO_2$ fine particles. Further, on the uneven structure layer 20, an anode 50 made of indium tin oxide (ITO) having a film thickness of 50 nm, a luminescent layer 40 including an α-NPD film having a film thickness of 70 nm and an $Alq_3$ film having a film thickness of 60 nm, and a cathode 30 made of aluminum having a film thickness of 100 nm were laminated. Thus, the organic EL (electroluminescent) device shown in FIG. 2 was formed.

Figure 17:
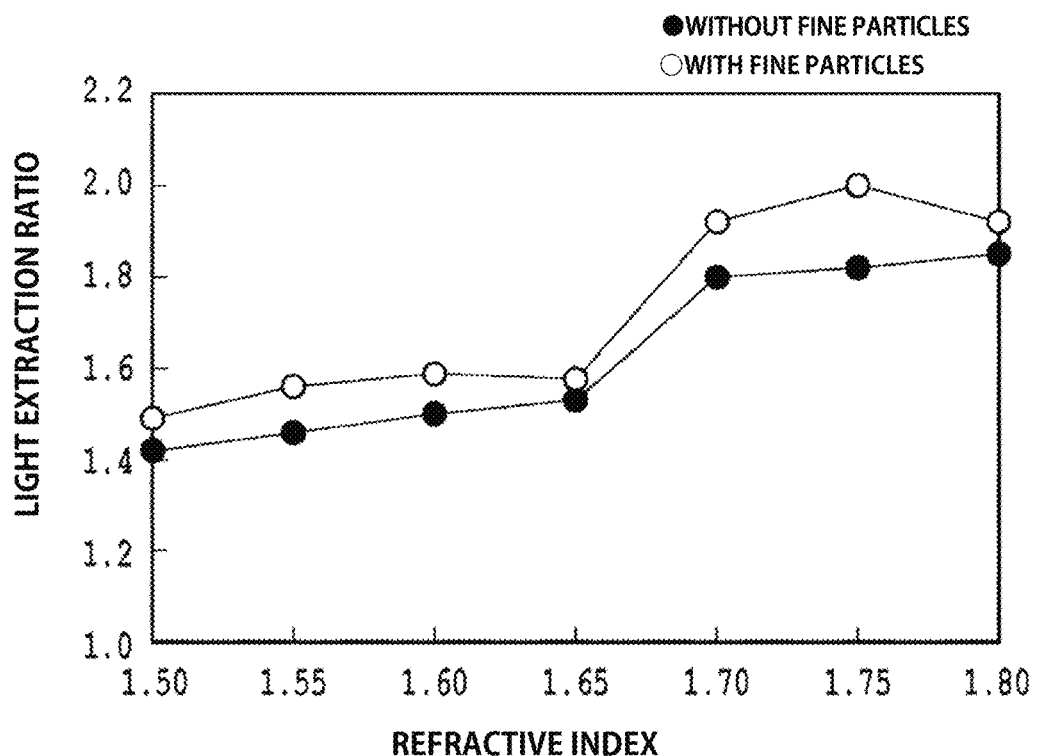
FIG. 17 is a graph showing the change in the light extraction ratio with respect to the refractive index of the uneven structure.

Assuming that the total luminous flux extracted to the outside from the organic EL (electroluminescent) device fabricated without forming the uneven structure layer 20 is 1.0, the light extraction ratio of the organic EL (electroluminescent) device was measured. The results are shown in FIG. 17. It can be seen from FIG. 17 that, when the refractive index of the uneven structure layer 20 is equal to or greater than 1.7, the light extraction efficiency can be improved.

Figure 18:
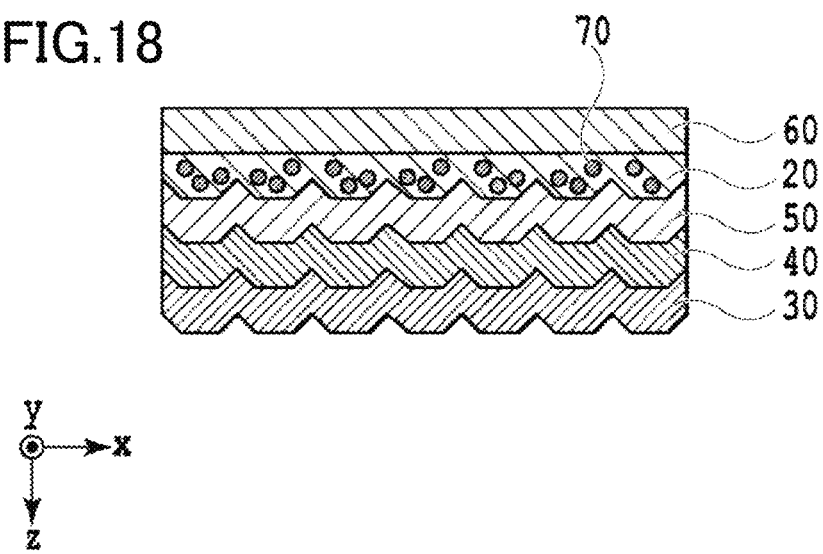
FIG. 18 is a schematic cross-sectional view of an organic EL (electroluminescent) device having an uneven structure including light scattering fine particles.

Further, it was found that, when light scattering fine particles 70 are added to the uneven structure layer 20 as shown in FIG. 18, the light extraction efficiency can be further improved. $SiO_2$ fine particles with a diameter of 0.5 μm were added at 30 wt % to the material whose refractive index is adjusted by adding $ZrO_2$ fine particles. Using the obtained light scattering material, an uneven structure layer 20 was formed in the same manner as described above, and the anode 50, the luminescent layer 40 and the cathode 30 were formed thereon. Assuming that the total luminous flux extracted to the outside from the organic EL (electroluminescent) device fabricated without forming the uneven structure layer 20 is 1.0, the light extraction ratio of the organic EL (electroluminescent) device was measured. The results are shown in FIG. 17. It can be understood from FIG. 17 that the light extraction ratio has been improved at every refractive index. In particular, at refractive indices of 1.7 and greater, improvement in light extraction ratio is remarkable.

Possible light scattering fine particles 70 include $TiO_2$, $SiO_2$, $Al_2O_3$, ZrO, $CaCO_3$, $BaSO_4$, and $Mg_3Si_4O_{10}(OH)_2$. The light scattering fine particles 70 may have a diameter of several tens of nm to several hundreds of μm.

Preferably, the film thickness of the uneven structure layer 20 is 0.005 to 100 μm. With such film thickness, it becomes easy to function as a light scattering layer by introducing light scattering fine particles, and also, generation of dark spots in the luminescent layer 40 can be suppressed by reducing the amount of water contained. The height of the uneven structure provided on the surface of the uneven structure layer 20 is desirably set to a level that can suppress generation of leak spots where the cathode 30 and the anode 50 contact each other.

Figure 19A:
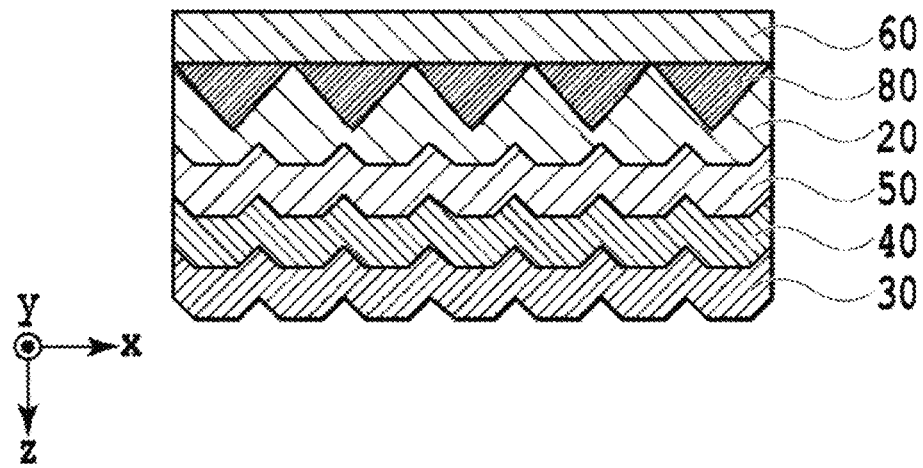
FIG. 19A is a schematic cross-sectional view of an organic EL (electroluminescent) device having a prism structure not including light scattering fine particles.

As another method of improving light extraction efficiency by light scattering, as shown in FIG. 19A, a prism structure 80 can be provided inside the organic EL (electroluminescent) device. The prism structure 80 refracts light at the interface with the uneven structure layer 20 so that the incident angle with respect to the interface between the translucent substrate 60 and the air becomes small, thereby serving to suppress total refraction at that interface. Thus, the prism structure 80 preferably has a refractive index smaller than 1.7 which is smaller than that of the uneven structure layer 20. Preferably, the prism structure 80 is included of a plurality of generally quadrangular pyramid parts. Although it depends on the material and film thickness of the luminescent layer, preferably, the inclination of a side face of the generally quadrangular pyramid is about 45 degrees.

Figure 19B:
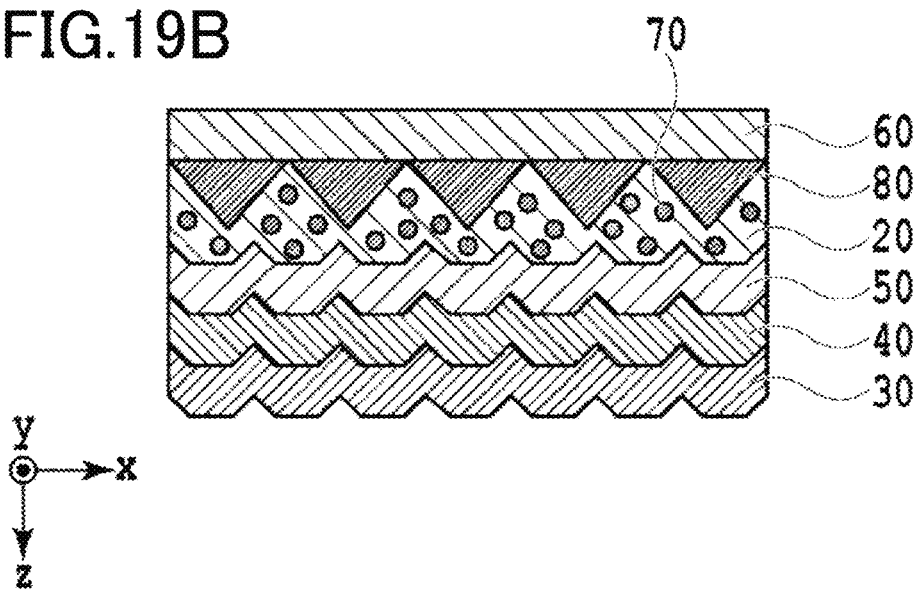
FIG. 19B is a schematic cross-sectional view of an organic EL (electroluminescent) device having a prism structure including light scattering fine particles.

Further, as shown in FIG. 19B, the uneven structure layer 20 including light scattering fine particles 70 and the prism structure 80 may both be used.

Such structures can be obtained by stacking constituent layers such as the uneven structure layer 20, the prism structure 80, the anode 50, the luminescent layer 40, and the cathode 30 on the translucent substrate 60 such as a glass substrate. The translucent substrate 60, the uneven structure layer 20, the prism structure 80, the anode 50 and the like may be manufactured by the roll-to-roll process. In addition, the luminescent layer 40 made of an organic material may be manufactured by the roll-to-roll process using a polymer material or the like for the luminescent layer 40. As compared with a prior art method including obtaining an organic EL (electroluminescent) device by stacking device components (the anode, cathode, and luminescent layer) on the glass substrate, forming a light scattering film on a plastic substrate, and bonding the organic EL (electroluminescent) device and the light scattering film together using an adhesive, manufacturing by the roll-to-roll process is advantageous in simplification of the steps, reduction of lead time, and reduction of the manufacturing cost.

EXAMPLES

Example 1

Alq$_3$ used as the luminescent material has a photoluminescence (PL) emission spectrum with a central wavelength of 556.3 nm. 95% of the entire PL emission spectrum of Alq$_3$ is included in the range from 449.4 nm to 663.2 nm. The upper and lower limits of this wavelength range correspond to $\lambda_1$ and $\lambda_2$ obtained from Eq. (II) and Eq. (III) with k=1.1.

Using the relative permittivity of Alq$_3$ (3.53) as $\varepsilon_1$ and the relative permittivity of Al (−31.47+9.2 li) as $\varepsilon_2$, $\lambda_1$ and $\lambda_2$ were substituted into $\lambda$ of Eq. (I), and $v_1$ and $v_2$ were set to $\frac{1}{226}$ nm$^{-1}$ and $\frac{1}{334}$ nm$^{-1}$, respectively. In the surface plasmon absorption suppression area 142 of the two-dimensional spatial frequency spectrum shown in FIG. 10, the designed range within the range spatial frequencies v that satisfy $\frac{1}{334}$ nm$^{-1}$ to $\frac{1}{226}$ nm$^{-1}$ is set so that the value of F(u, v) is the maximum value 1.0 (in terms of the image tone, gray scale 255), and the value of F(u, v) outside this range is 0.0 (in terms of the image tone, gray scale 0). On the other hand, in the light scattering area 144 of the two-dimensional spatial frequency spectrum shown in FIG. 10, the value of F(u, v) in the range of spatial frequencies v smaller than $\frac{1}{334}$ nm$^{-1}$ is the maximum value 1.0 (in terms of the image tone, gray scale 255), and the value of F(u, v) in the range of spatial frequencies v equal to or greater than $\frac{1}{334}$ nm$^{-1}$ is 0.0 (in terms of the image tone, gray scale 0), and calculation was carried out under such setting. Although there are simply two tones, i.e., 1 and 0 in this calculation, if light of a particular wavelength is desired to be extracted considering the color temperature and rendering index of the light extracted outside, it is possible to set the value of F(u, v) of the wavelength desired to be extracted to the maximum value 1.0 (in terms of the image tone, gray scale 255) and that of a wavelength desired to be suppressed close to 0.0 (in terms of the image tone, gray scale 0), and set those of the wavelengths between them in a linear gray scale. The two-dimensional spatial frequency spectrum thus obtained was subjected to inverse Fourier transformation to determine the uneven structure. A part of the obtained uneven structure is shown in FIG. 12. The value in the z-axis direction of the uneven structure was adjusted so that the height of the uneven structure becomes 50 nm.

An ultraviolet curable resin containing ZrO$_2$ nanoparticles was coated on one side of a PET film having a film thickness of 100 μm, and it was irradiated with ultraviolet rays in such a pattern that the thus obtained uneven structure is formed. The other surface of the PET film was fixed to one surface of the glass substrate using an adhesive film to obtain a laminate of the translucent substrate 60 and the uneven structure layer 20. The translucent substrate 60 of this example has a laminated structure of a PET film, an adhesive film, and a glass substrate. Further, the obtained uneven structure layer 20 had a refractive index of 1.7.

Next, as shown in FIG. 7A, an uneven light extraction film having a plurality of quadrangular pyramid recesses 92 was formed on a transparent support 90 made of PET. The pitch and the depth of the square pyramid recesses 92 were 50 μm and 25 μm, respectively. Thus, the inclination angle of the side faces of the quadrangular pyramid recesses were 45 degrees. The direction 122 in which light extraction is easy and the direction 124 in which light extraction is difficult of the uneven light extraction film are as shown in FIG. 8B. The transparent support 90 of the uneven light extraction film was bonded to the surface of the translucent substrate 60 on which the uneven structure layer 20 is not formed.

Then, on the uneven structure layer 20, an anode 50 made of indium tin oxide (ITO) having a film thickness of 50 nm, a luminescent layer 40 including an α-NPD film having a film thickness of 70 nm and an Alq$_3$ film having a film thickness of 60 nm, and a cathode 30 made of Al having a film thickness of 100 nm were formed. Thus, an organic EL (electroluminescent) device was formed.

Example 2

Except for forming the uneven structure layer 20 using an ultraviolet curable resin further containing SiO$_2$ light scattering fine particles at 30% in addition to ZrO$_2$ nanoparticles, the procedure of Example 1 was repeated to obtain an organic EL (electroluminescent) device.

Comparative Example 1

Figure 20:
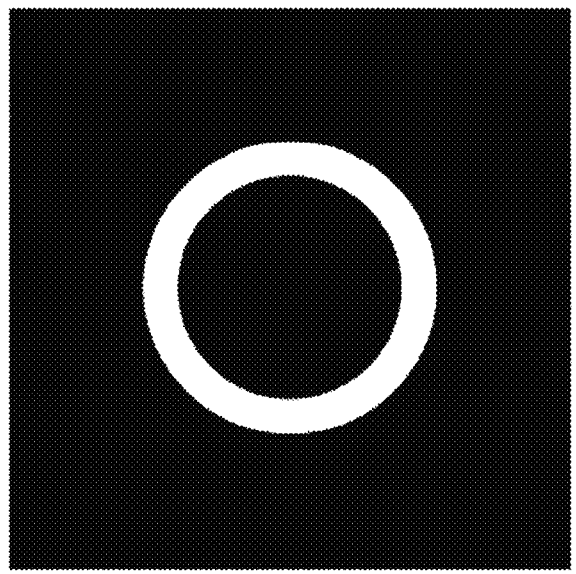
FIG. 20 shows a two-dimensional spatial frequency spectrum described in prior art.
Figure 20:
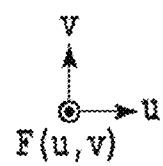

In the annular two-dimensional spatial frequency spectrum shown in FIG. 20 in which the light scattering area 144 does not exist, the spatial frequency of the outer circumference was set to $\frac{1}{226}$ nm$^{-1}$ and the spatial frequency of the inner circumference was set to $\frac{1}{334}$ nm$^{-1}$, and the value of F(u, v) in the annular area was set to the maximum value 1.0 (in terms of the image tone, gray scale 255) and the value of F(u, v) in the part other than the annular area was set to 0.0 (in terms of the image tone, gray scale 0). The two-dimensional spatial frequency spectrum thus obtained was subjected to inverse Fourier transformation to determine the uneven structure. The value in the z-axis direction of the uneven structure was adjusted so that the height of the uneven structure becomes 50 nm. Using the obtained uneven structure, an organic EL (electroluminescent) device was formed by repeating the procedure of Example 1.

Comparative Example 2

Except for not forming the uneven structure layer 20, an organic EL (electroluminescent) device was formed by repeating the procedure of Example 1.
(Evaluation 1)

Assuming that the total luminous flux extracted to the outside from the organic EL (electroluminescent) device of Comparative Example 2 is 1.0, the light extraction ratio of the organic EL (electroluminescent) devices of Examples 1 and 2 and Comparative Example 1 were measured. As a result, the organic EL (electroluminescent) device of Comparative Example 1 having a two-dimensional spatial frequency spectrum consisting of only the surface plasmon absorption suppression area showed a light extraction ratio of 1.6. On the other hand, the organic EL (electroluminescent) device of Example 1 having a two-dimensional spatial frequency spectrum consisting of four surface plasmon absorption suppression areas 142 and four light scattering areas 144 showed a light extraction ratio of 1.82. From these results, it can be understood that providing light scattering areas 144 corresponding to the directions in which light extraction is difficult of the uneven light extraction film is effective to improve the light extraction efficiency.

Further, the organic EL (electroluminescent) device of Example 2 including the uneven structure layer 20 containing light scattering fine particles at 30% showed a light extraction ratio of 2.00. From this result, it can be understood that light scattering inside the organic EL (electroluminescent) device, more specifically in the uneven structure layer 20, is effective for improving the light extraction efficiency.

Example 3

Figure 21:
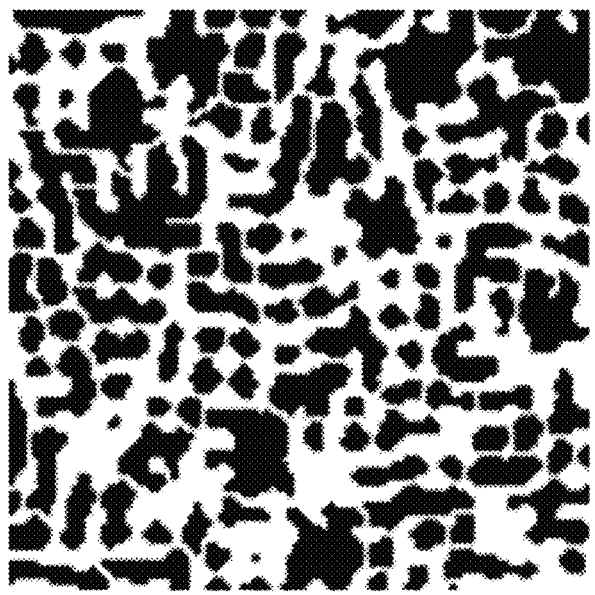
FIG. 21 is a schematic top view showing an uneven structure of the cathode of Example 3 having an uneven structure obtained by dividing the continuous parts in the uneven structure of FIG. 13 into very small units using the watershed algorithm.
Figure 21:
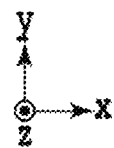

In the uneven structure shown in FIG. 12 used in Example 1, there are parts where black areas indicating protrusions continue. In such an uneven structure, the cathode 30 and the anode 50 may be short-circuited at the part where black areas continue due to, for example, contamination of a foreign substance while manufacturing the device, and a leak spot may be produced. In view of this, an uneven structure shown in FIG. 21 was obtained by using a watershed algorithm (see Non-PTL 1) and dividing the parts where the protrusions continue into very small units. The maximum in-plane dimension of the small units were varied from 0.1 mm to 1.5 mm. Using the uneven structure shown in FIG. 21, an organic EL (electroluminescent) device with an emission section of 120 mm*120 mm was formed by repeating the procedure of Example 1
(Evaluation 2)

The thus obtained organic EL (electroluminescent) device was caused to emit light with a luminance of 1000 cd/m². In this state, the existence of non-light emitting points (leak spots) of the organic EL (electroluminescent) device was observed at a distance of 0.5 m, 1 m, and 5 m. In addition, assuming that the total luminous flux extracted to the outside from the organic EL (electroluminescent) device of Comparative Example 2 is 1.0, the light extraction ratio of the organic EL (electroluminescent) device was measured. The results are shown in Table 1.

TABLE 1

The effect of limiting the size of the small units of the uneven structure

| Maximum in-plane dimension of the small units of the uneven structure | Observation distance | | | Light extraction efficiency |
| --- | --- | --- | --- | --- |
| | 5 m | 1 m | 0.5 m | |
| 0.1 mm | ○ | ○ | ○ | 1.71 |
| 0.2 mm | ○ | ○ | ○ | 1.75 |
| 0.5 mm | ○ | ○ | ○ | 1.77 |
| 1.0 mm | ○ | ○ | Δ | 1.77 |
| 1.2 mm | ○ | Δ | x | 1.78 |
| 1.5 mm | Δ | x | x | 1.80 |

○: Non-light emitting parts not observed
Δ: Non-light emitting parts observed to some degree
x: Non-light emitting parts conspicuous As can be seen from Table 1, the smaller the in-plane maximum dimension of the small units of the uneven structure, the less conspicuous the leak spots become. In practical use, since it is rare to use the device at an observation distance of 1 m or less, an organic EL (electroluminescent) device with a sufficient performance can be obtained by setting the maximum in-plane dimension of the small units of the uneven structure to 0.1 mm or less.

On the other hand, reducing the maximum in-plane dimension of the small units of the uneven structure results in increasing the high spatial frequency components of the Fourier transform image of the uneven structure. From Table 1, it can be seen that as the maximum in-plane dimension of the small units of the uneven structure decreases, the light extraction ratio also gently decreases. It is considered that the gentle decrease in the light extraction ratio is due to deviation from the optimum design caused by the increase in the high spatial frequency components.
(Evaluation 3)

A test was performed on the organic EL (electroluminescent) device of Example 1 and the organic EL (electroluminescent) device of Example 3 where the maximum in-plane dimension of the small units of the uneven structure is 1.0 mm to measure their correlation between voltage and current density. The results are shown in FIG. 22.

Figure 22:
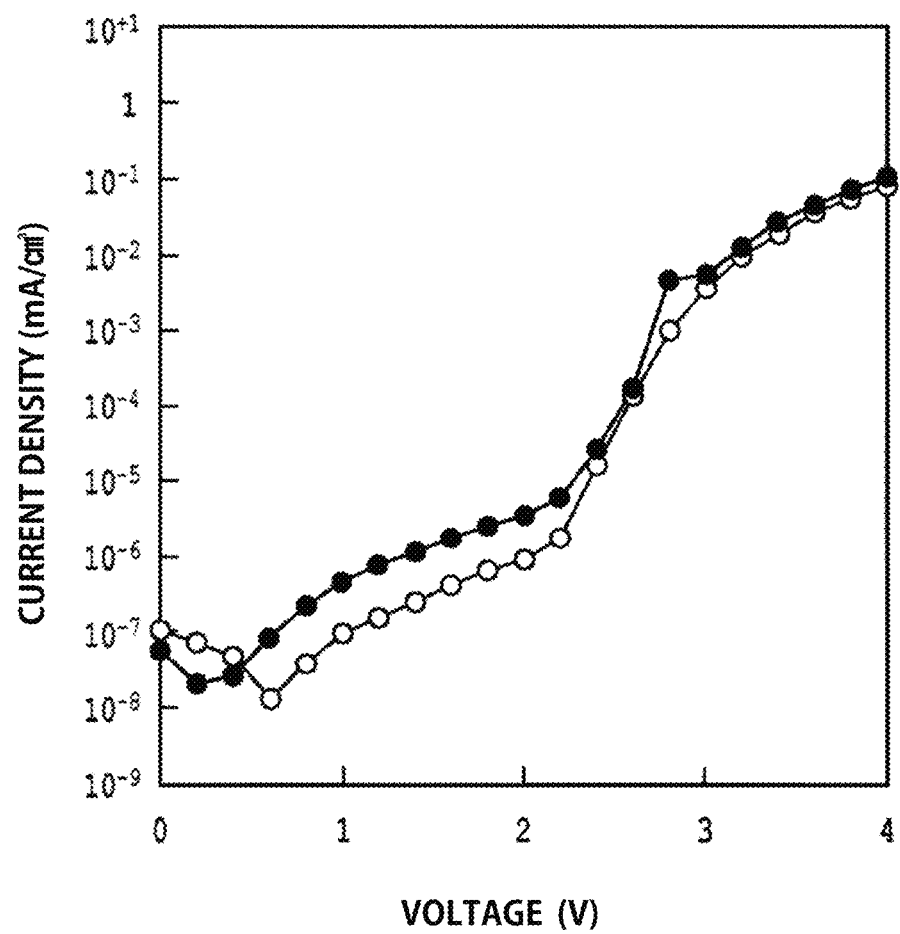
FIG. 22 is a graph showing the relationship between voltage and current density of the organic EL (electroluminescent) devices of Examples 1 and 3.

It can be seen from FIG. 22 that the current density of the organic EL (electroluminescent) device of Example 3 is reduced overall as compared with the organic EL (electroluminescent) device of Example 1, and the effect obtained by dividing the continuous protrusion parts into small units was confirmed. In addition, assuming that the total luminous flux extracted to the outside from the organic EL (electroluminescent) device of Comparative Example 2 is 1.0, the light extraction ratio of the organic EL (electroluminescent) device of Example 3 was 1.77.

As described above, the present invention has an aspect to effectively alleviate surface plasmon absorption at the cathode of an organic EL (electroluminescent) device and improve the light extraction efficiency.

An organic EL (electroluminescent) device of a first aspect of the present invention includes a translucent substrate having a first surface and a second surface; a transparent electrode, a cathode, and a luminescent layer provided between the transparent electrode and the cathode which are formed over the first surface; and a light extraction film having unevenness placed on the second surface, wherein the cathode has a plurality of recesses or protrusions on the surface thereof facing the luminescent layer, and the Fourier transform image of the surface of the cathode facing the luminescent layer includes one or more surface plasmon absorption suppression areas including a spatial frequency v obtained by Equation (I) and one or more light scattering areas not including a spatial frequency that is equal to or greater than the spatial frequency v.

Equation 1

$$v = \frac{1}{\lambda} \times \mathrm{Re}\left(\sqrt{\frac{\varepsilon_1 \times \varepsilon_2}{\varepsilon_1 + \varepsilon_2}}\right) \quad (I)$$

(wherein $\varepsilon_1$ is the relative permittivity of the luminescent layer, $\varepsilon_2$ is the relative permittivity of the cathode, Re( ) is a function for extracting the real part of a complex number, and $\lambda$ is the central wavelength of the emission spectrum of the luminescent layer)

An organic EL (electroluminescent) device of a second aspect of the present invention is characterized in that, in the organic EL (electroluminescent) device of the first aspect, the one or more surface plasmon absorption suppression areas include spatial frequencies v that are $v_1$ or greater to $v_2$ or less, and the one or more light scattering areas do not include spatial frequencies v that are $v_1$ or greater to $v_2$ or less. $v_1$ and $v_2$ are obtained by, assuming that $\lambda_p$ represents the peak wavelength of the emission spectrum of the luminescent layer, $S(\lambda)$ represents the intensity at the wavelength $\lambda$, $\lambda_{min}$ represents the minimum wavelength that satisfies $S(\lambda) > S(\lambda_p)/100$, $\lambda_{max}$ represents the maximum wavelength that satisfies $S(\lambda) > S(\lambda_p)/100$, and k represents a real number larger than 0.8, substituting $\lambda_1$ and $\lambda_2$ obtained from Equation (II) and Equation (III) to $\lambda$ of Equation (I).

$$\lambda_1 = k \times \lambda_{min} \quad (II)$$

$$\lambda_2 = (1/k) \times \lambda_{max} \quad (III)$$

An organic EL (electroluminescent) device of a third aspect of the present invention is characterized in that, in the organic EL (electroluminescent) device of the first aspect, the emission spectrum of the luminescent layer has a plurality of emission peak wavelengths $\lambda_{p1} \ldots \lambda_{pn}$, and the surface plasmon absorption suppression area includes spatial frequencies $v_{p1} \ldots v_{pn}$ obtained by substituting $\lambda_{p1} \ldots \lambda_{pn}$ to $\lambda$ of Equation (I).

An organic EL (electroluminescent) device of a fourth aspect of the present invention is characterized in that, in the organic EL (electroluminescent) devices of the first to third aspects, an uneven structure layer having a plurality of protrusions or recesses is further included, and the uneven structure layer, the transparent electrode, the luminescent layer, and the cathode are stacked in this order on the first surface of the translucent substrate.

An organic EL (electroluminescent) device of a fifth aspect of the present invention is characterized in that, in the organic EL (electroluminescent) device of the fourth aspect, the refractive index of the uneven structure layer is 1.7 or greater.

An organic EL (electroluminescent) device of a sixth aspect of the present invention is characterized in that, in the organic EL (electroluminescent) device of the fourth aspect, the uneven structure layer includes light scattering fine particles.

An organic EL (electroluminescent) device of a seventh aspect of the present invention is characterized in that, in the organic EL (electroluminescent) device of the fourth aspect, a prism structure is further included, and the prism structure is provided between the translucent substrate and the uneven structure layer, and the refractive index of the prism structure is 1.7 or less.

An organic EL (electroluminescent) device of a eighth aspect of the present invention is characterized in that, in the organic EL (electroluminescent) device of the fourth aspect, the plurality of protrusions or recesses of the uneven structure layer have an in-plane dimension of 1 mm or less.

The organic EL (electroluminescent) device of the first aspect of the present invention provides a high light extraction efficiency by including, on the surface of the cathode, an uneven structure having a spatial frequency that is effective for suppressing surface plasmon absorption corresponding to the light extraction easy direction of the uneven light extraction film, and an uneven structure having a spatial frequency effective for scattering light corresponding to the light extraction difficult direction of the uneven light extraction film.

The organic EL (electroluminescent) device of the second aspect of the present invention adapts the spatial frequency of the uneven structure having a spatial frequency that is effective for suppressing surface plasmon absorption of the cathode to the emission spectrum of the luminescent layer so that the surface plasmon absorption at the surface of the cathode can be more efficiently suppressed.

The organic EL (electroluminescent) device of the third aspect of the present invention sets the spatial frequency for suppressing surface plasmon absorption of the cathode in accordance with the luminescent layer having a plurality of emission wavelength peaks so that change in the distribution of the emission spectrum can be reduced, and at the same time the surface plasmon absorption at the surface of the cathode can be more efficiently suppressed.

The organic EL (electroluminescent) device of the fourth aspect of the present invention introduces an uneven structure to, in addition to the surface of the cathode, the anode and the luminescent layer so as to enhance the light scattering property at the interface thereof and realize a higher light extraction efficiency.

The organic EL (electroluminescent) device of the fifth aspect of the present invention realizes a higher light extraction efficiency by suppressing the total reflection at the interface between the uneven structure layer and the anode.

The organic EL (electroluminescent) device of the sixth aspect of the present invention realizes a higher light extraction efficiency by scattering light in the uneven structure layer and suppressing the total reflection at the interface between the translucent substrate and the air.

The organic EL (electroluminescent) device of the seventh aspect of the present invention realizes a higher light extraction efficiency by suppressing the total reflection at the interface between the uneven structure layer and the translucent substrate.

The organic EL (electroluminescent) device of the eighth aspect of the present invention makes it possible to maintain good appearance during operation even when leak spots are generated by limiting their dimension to a range of 1 mm or less.

REFERENCE SIGNS LIST

10 Substrate
20 Uneven structure layer

30 Cathode
40 Luminescent layer
50 Anode
60 Translucent substrate
70 Light scattering fine particle
80 Prism structure
90 Transparent support
92 Protrusion or recess
122 Light extraction easy direction
124 Light extraction difficult direction
142 Surface plasmon absorption suppression area
144 Light scattering area Obviously, numerous modifications and variations of the present invention are possible in light of the above teachings. It is therefore to be understood that within the scope of the appended claims, the invention may be practiced otherwise than as specifically described herein.

What is claimed is:

1. An organic EL device, comprising:
a translucent substrate having a first surface and a second surface opposite to the first surface;
a transparent electrode formed on the first surface of the translucent substrate;
a cathode having a surface on which a plurality of recesses or protrusions are formed;
a luminescent layer formed between the transparent electrode and the cathode and facing the surface of the cathode having the recesses or protrusions; and
a light extraction film positioned on the second surface of the translucent substrate and having unevenness,
wherein the cathode has the recesses or protrusions formed such that the surface has a Fourier transform image which includes at least one surface plasmon absorption suppression area having a spatial frequency v and at least one light scattering area that does not include a spatial frequency equal to or greater than the spatial frequency v, and the spatial frequency v is obtained from Equation (I)

$$v = \frac{1}{\lambda} \times \mathrm{Re}\left(\sqrt{\frac{\varepsilon_1 \times \varepsilon_2}{\varepsilon_1 + \varepsilon_2}}\right) \quad (I)$$

where $\varepsilon_1$ is a relative permittivity of the luminescent layer, $\varepsilon_2$ is a relative permittivity of the cathode, Re( ) is a function for extracting a real part of a complex number, and $\lambda$ is a central wavelength of an emission spectrum of the luminescent layer, the at least one surface plasmon absorption suppression area includes the spatial frequency v in a range of from $v_2$ to $v_1$, and the at least one light scattering area does not include a spatial frequency in the range of from $v_2$ to $v_1$, where the spatial frequency $v_1$ is a spatial frequency obtained by substituting $\lambda$ of Equation (I) with $\lambda_1$ obtained by Equation (II)

$$\lambda_1 = k \times \lambda_{min} \quad (II),$$

the spatial frequency $v_2$ is a spatial frequency obtained by substituting $\lambda$ of Equation (I) with $\lambda_2$ satisfying $\lambda_1 < \lambda_2$ and obtained by Equation (III)

$$\lambda_2 = (1/k) \times \lambda_{max} \quad (III),$$

$\lambda_{min}$ is a minimum wavelength satisfying $S(\lambda) > S(\lambda_p)/100$, $\lambda_{max}$ is a maximum wavelength satisfying $S(\lambda) > S(\lambda_p)/100$, k is a real number larger than 0.8, $\lambda_p$ is a peak wavelength of the emission spectrum of the luminescent layer, and $S(\lambda)$ is an intensity at the central wavelength $\lambda$.

2. The organic EL device of claim 1, wherein the luminescent layer has the emission spectrum having a plurality of emission peak wavelengths $\lambda_{p1} \ldots \lambda_{pn}$, and the surface plasmon absorption suppression area includes spatial frequencies $v_{p1} \ldots v_{pn}$ obtained by substituting $\lambda$ of Equation (I) with $\lambda_{p1} \ldots \lambda_{pn}$.

3. The organic EL device of claim 1, further comprising:
an uneven structure layer having a plurality of protrusions or recesses,
wherein the uneven structure layer, the transparent electrode, the luminescent layer, and the cathode are positioned in an order thereof.

4. The organic EL device of claim 1, further comprising:
an uneven structure layer having a plurality of protrusions or recesses,
wherein the transparent electrode, the luminescent layer, the cathode, and the uneven structure layer are positioned in an order thereof.

5. The organic EL device of claim 4, wherein the uneven structure layer has a refractive index of 1.7 or greater.

6. The organic EL device of claim 4, wherein the uneven structure layer comprises light scattering fine particles.

7. The organic EL device of claim 4, wherein the uneven structure layer has the protrusions or recesses having an in-plane dimension of 1 mm or less.

8. The organic EL device of claim 4, wherein the uneven structure layer has the protrusions or recesses having an in-plane dimension of 0.1 mm or less.

9. An organic EL device, comprising:
a translucent substrate having a first surface and a second surface opposite to the first surface;
a transparent electrode formed on the first surface of the translucent substrate;
a cathode having a surface on which a plurality of recesses or protrusions are formed;
a luminescent layer formed between the transparent electrode and the cathode and facing the surface of the cathode having the recesses or protrusions; and
a light extraction film positioned on the second surface of the translucent substrate and having unevenness,
wherein the cathode has the recesses or protrusions formed such that the surface has a Fourier transform image which includes at least one surface plasmon absorption suppression area having a spatial frequency v and at least one light scattering area that does not include a spatial frequency equal to or greater than the spatial frequency v, and the spatial frequency v is obtained from Equation (I)

$$v = \frac{1}{\lambda} \times \mathrm{Re}\left(\sqrt{\frac{\varepsilon_1 \times \varepsilon_2}{\varepsilon_1 + \varepsilon_2}}\right) \quad (I)$$

where $\varepsilon_1$ is a relative permittivity of the luminescent layer, $\varepsilon_2$ is a relative permittivity of the cathode, Re( ) is a function for extracting a real part of a complex number, and $\lambda$ is a central wavelength of an emission spectrum of the luminescent layer, the luminescent layer has the emission spectrum having a plurality of emission peak wavelengths $\lambda_{p1} \ldots \lambda_{pn}$, and the surface plasmon absorption suppression area includes spatial frequencies $v_{p1} \ldots v_{pn}$ obtained by substituting $\lambda$ of Equation (I) with $\lambda_{p1} \ldots \lambda_{pn}$.

10. The organic EL device of claim 9, further comprising:
an uneven structure layer having a plurality of protrusions or recesses, wherein the uneven structure layer, the transparent electrode, the luminescent layer, and the cathode are positioned in an order thereof.

11. The organic EL device of claim 10, wherein the uneven structure layer has a refractive index of 1.7 or greater.

12. The organic EL device of claim 9, further comprising:
an uneven structure layer having a plurality of protrusions or recesses,
wherein the transparent electrode, the luminescent layer, the cathode, and the uneven structure layer are positioned in an order thereof.

13. An organic EL device, comprising:
a translucent substrate having a first surface and a second surface opposite to the first surface;
a transparent electrode formed on the first surface of the translucent substrate;
a cathode having a surface on which a plurality of recesses or protrusions are formed;
a luminescent layer formed between the transparent electrode and the cathode and facing the surface of the cathode having the recesses or protrusions;
a light extraction film positioned on the second surface of the translucent substrate and having unevenness; and
an uneven structure layer having a plurality of protrusions or recesses and formed such that the uneven structure layer, the transparent electrode, the luminescent layer, and the cathode are positioned in an order thereof,
wherein the cathode has the recesses or protrusions formed such that the surface has a Fourier transform image which includes at least one surface plasmon absorption suppression area having a spatial frequency v and at least one light scattering area that does not include a spatial frequency equal to or greater than the spatial frequency v, and the spatial frequency v is obtained from Equation (I)

$$v = \frac{1}{\lambda} \times \mathrm{Re}\left(\sqrt{\frac{\varepsilon_1 \times \varepsilon_2}{\varepsilon_1 + \varepsilon_2}}\right) \quad (\mathrm{I})$$

where $\varepsilon_1$ is a relative permittivity of the luminescent layer, $\varepsilon_2$ is a relative permittivity of the cathode, Re( ) is a function for extracting a real part of a complex number, and $\lambda$ is a central wavelength of an emission spectrum of the luminescent layer.

14. The organic EL device of claim 13, wherein the uneven structure layer has a refractive index of 1.7 or greater.

15. The organic EL device of claim 13, wherein the uneven structure layer comprises light scattering fine particles.

16. The organic EL device of claim 15, further comprising:
a prism structure positioned between the translucent substrate and the uneven structure layer and having a refractive index of 1.7 or less.

17. The organic EL device of claim 13, further comprising:
a prism structure positioned between the translucent substrate and the uneven structure layer and having a refractive index of 1.7 or less.

18. The organic EL device of claim 13, wherein the uneven structure layer has the protrusions or recesses having an in-plane dimension of 1 mm or less.

19. The organic EL device of claim 13, wherein the uneven structure layer has the protrusions or recesses having an in-plane dimension of 0.1 mm or less.

20. The organic EL device of claim 13, wherein the uneven structure layer has an uneven structure having a height of from about 20 nm to about 100 nm.

* * * * *